United States Patent
Podemski et al.

(10) Patent No.: US 9,549,482 B2
(45) Date of Patent: Jan. 17, 2017

(54) CABINET FRAME ENCLOSURES, FRAME MEMBERS AND CORRESPONDING METHODS

(71) Applicant: Emerson Network Power, Energy Systems, North America, Inc., Warrenville, IL (US)

(72) Inventors: Matthew Allan Podemski, Auburn, AL (US); Jerome Andrew Maloney, Sugar Grove, IL (US)

(73) Assignee: Emerson Network Power, Energy Systems, North America, Inc., Warrenville, IL (US)

( * ) Notice: Subject to any disclaimer, the term of this patent is extended or adjusted under 35 U.S.C. 154(b) by 0 days.

(21) Appl. No.: 14/873,887

(22) Filed: Oct. 2, 2015

(65) Prior Publication Data

US 2016/0073532 A1    Mar. 10, 2016

Related U.S. Application Data

(63) Continuation of application No. 14/732,261, filed on Jun. 5, 2015.

(Continued)

(51) Int. Cl.
  *A47B 47/00* (2006.01)
  *H05K 7/02* (2006.01)
  (Continued)

(52) U.S. Cl.
  CPC ............... *H05K 7/02* (2013.01); *F16B 12/46* (2013.01); *H05K 7/183* (2013.01)

(58) Field of Classification Search
  CPC ........... H02B 1/014; H02B 1/013; H02B 1/28; H02B 1/301; H05K 9/0015; A47B 2230/01; A47B 47/0008; A47B 47/045; A47B 47/03
  (Continued)

(56) References Cited

U.S. PATENT DOCUMENTS 2,956,705 A    10/1960  Clingman
2,972,495 A *   2/1961  Yalen ...................... F16B 7/025
                                                          108/158.11

(Continued)

FOREIGN PATENT DOCUMENTS

AU    2009251101    7/2010
AU    2009251099    5/2014

(Continued)

OTHER PUBLICATIONS

Quick Frame Reference Guide, Steven Engineering, https://stevenengineering.com/tech_support/PDFs/83QF.pdf, 50 pages.

(Continued)

*Primary Examiner* — Janet M Wilkens
(74) *Attorney, Agent, or Firm* — Harness, Dickey & Pierce, P.L.C.

(57) ABSTRACT

According to some aspects of the present disclosure, systems and methods are disclosed for cabinet frames, including frame members coupled together via corner copulas. Frame members may include external and internal channels and surfaces for mounting external and internal components. Systems and methods are also disclosed for coupling the frame members and corner copulas.

18 Claims, 31 Drawing Sheets

Related U.S. Application Data

(60) Provisional application No. 62/046,567, filed on Sep. 5, 2014.

(51) Int. Cl.
*F16B 12/46* (2006.01)
*H05K 7/18* (2006.01)

(58) Field of Classification Search
USPC ..... 403/169–178, 248–250, 231, 21, 7, 403; 52/655.1; 312/265.1–265.4, 223.1, 140, 312/296; 211/26, 189, 182, 175, 191, 192
See application file for complete search history.

(56) References Cited

U.S. PATENT DOCUMENTS

| | | | |
|---|---|---|---|
| 3,087,768 A | 4/1963 | Anderson et al. | |
| 3,218,097 A * | 11/1965 | Bowers | A47B 47/0008 285/231 |
| 3,542,407 A | 11/1970 | Brown | |
| 3,638,803 A | 2/1972 | MacMillan | |
| 3,642,310 A * | 2/1972 | Hudson | F16B 7/0446 160/381 |
| 3,645,569 A * | 2/1972 | Reilly | A47B 47/0008 403/217 |
| 3,815,966 A | 6/1974 | Lyman, Jr. | |
| 3,834,549 A | 9/1974 | Burg et al. | |
| 3,864,051 A * | 2/1975 | Reid | A47B 47/0016 211/182 |
| 3,893,774 A * | 7/1975 | Hashioka | F16B 7/0446 211/182 |
| 3,949,836 A * | 4/1976 | Russo | E06C 7/086 182/194 |
| 3,966,285 A | 6/1976 | Porch et al. | |
| 4,045,104 A | 8/1977 | Peterson | |
| 4,161,375 A * | 7/1979 | Murphy | F16B 7/0446 403/169 |
| 4,544,069 A | 10/1985 | Cavallini | |
| 4,610,561 A | 9/1986 | Cecchellero et al. | |
| 4,678,359 A | 7/1987 | Keen | |
| 4,691,970 A | 9/1987 | Neri | |
| 4,712,695 A | 12/1987 | Cheng | |
| 4,768,845 A | 9/1988 | Yeh | |
| 4,770,560 A | 9/1988 | Ott | |
| 4,869,380 A | 9/1989 | Metcalfe et al. | |
| 4,900,108 A | 2/1990 | Tischer | |
| 4,968,105 A * | 11/1990 | Schaars | A47B 47/0008 312/140 |
| 5,011,323 A | 4/1991 | Liuo | |
| 5,020,866 A | 6/1991 | McIlwraith | |
| 5,165,770 A | 11/1992 | Hahn | |
| 5,228,762 A | 7/1993 | Mascrier | |
| 5,333,950 A | 8/1994 | Zachrai | |
| 5,388,903 A | 2/1995 | Jones et al. | |
| 5,423,604 A | 6/1995 | Chern | |
| 5,451,115 A | 9/1995 | Sayres | |
| 5,548,085 A | 8/1996 | Flores | |
| 5,556,218 A | 9/1996 | Homer | |
| 5,580,181 A | 12/1996 | Nomura | |
| 5,695,263 A | 12/1997 | Simon et al. | |
| 5,713,651 A | 2/1998 | Essig et al. | |
| 5,806,946 A | 9/1998 | Benner et al. | |
| 5,820,289 A | 10/1998 | Kern et al. | |
| 5,997,117 A | 12/1999 | Krietzman | |
| 6,062,664 A | 5/2000 | Benner | |
| 6,102,498 A | 8/2000 | Kohler et al. | |
| 6,116,615 A | 9/2000 | Trehan | |
| 6,123,400 A | 9/2000 | Nicolai et al. | |
| 6,179,398 B1 | 1/2001 | Martin | |
| 6,223,917 B1 | 5/2001 | Bruder | |
| 6,516,955 B1 | 2/2003 | Dudhwala et al. | |
| 6,655,533 B2 | 12/2003 | Guebre-Tsadik | |
| 6,808,240 B2 | 10/2004 | Altena | |
| 6,969,211 B2 | 11/2005 | Altman | |
| 7,896,177 B1 | 3/2011 | Toma | |
| 8,091,970 B2 | 1/2012 | Francisquini | |
| 8,128,183 B2 | 3/2012 | Shen et al. | |
| 8,297,450 B2 | 10/2012 | Zavidniak et al. | |
| 8,365,929 B2 | 2/2013 | Luo | |
| 8,403,431 B2 | 3/2013 | Elkins et al. | |
| 8,599,540 B2 | 12/2013 | Fernandez | |
| 8,621,877 B2 | 1/2014 | Tuszkiewicz et al. | |
| 8,707,653 B2 | 4/2014 | Calleja | |
| 8,714,667 B2 | 5/2014 | Lakoduk et al. | |
| 8,783,798 B2 | 7/2014 | Zhang | |
| 2003/0174487 A1 | 9/2003 | Garmong | |
| 2006/0157436 A1 | 7/2006 | Iwamoto | |
| 2007/0247040 A1 | 10/2007 | Cardenas | |
| 2008/0272677 A1 | 11/2008 | Francisquini | |
| 2009/0175678 A1 | 7/2009 | Nientiedt et al. | |
| 2009/0178821 A1 * | 7/2009 | Zavidniak | H05K 7/183 174/51 |
| 2011/0012489 A1 | 1/2011 | Shen et al. | |
| 2011/0114575 A1 | 5/2011 | Peng et al. | |
| 2011/0114576 A1 | 5/2011 | Hsiao et al. | |
| 2011/0194892 A1 | 8/2011 | Huang | |
| 2012/0170972 A1 | 7/2012 | Song | |
| 2012/0301215 A1 | 11/2012 | Huang | |
| 2013/0069501 A1 | 3/2013 | Liu | |
| 2013/0213908 A1 | 8/2013 | Hofmann et al. | |
| 2013/0256251 A1 | 10/2013 | Oboza et al. | |
| 2013/0306584 A1 | 11/2013 | Hofmann et al. | |

FOREIGN PATENT DOCUMENTS

| | | |
|---|---|---|
| AU | 2009251100 | 5/2014 |
| EP | 422283 | 4/1991 |
| EP | 872930 | 7/2002 |
| EP | 834974 | 12/2002 |
| EP | 1152194 | 5/2004 |
| EP | 1890367 | 12/2009 |
| FR | 2726730 * | 5/1996 |
| GB | 826200 | 12/1959 |
| GB | 2212879 | 8/1989 |
| GB | 2313870 | 12/1997 |
| GB | 2366084 | 2/2002 |
| KR | 200306183 | 3/2003 |
| WO | 8603265 | 6/1986 |
| WO | 9414307 | 6/1994 |
| WO | 9517082 | 6/1995 |
| WO | 2008124910 | 10/2008 |
| WO | 2008124911 | 10/2008 |

OTHER PUBLICATIONS

System Cabinet InterRack, http://www.intermas-el.com/intermas/pdf/InterRack_en.pdf, 10 pages.

* cited by examiner

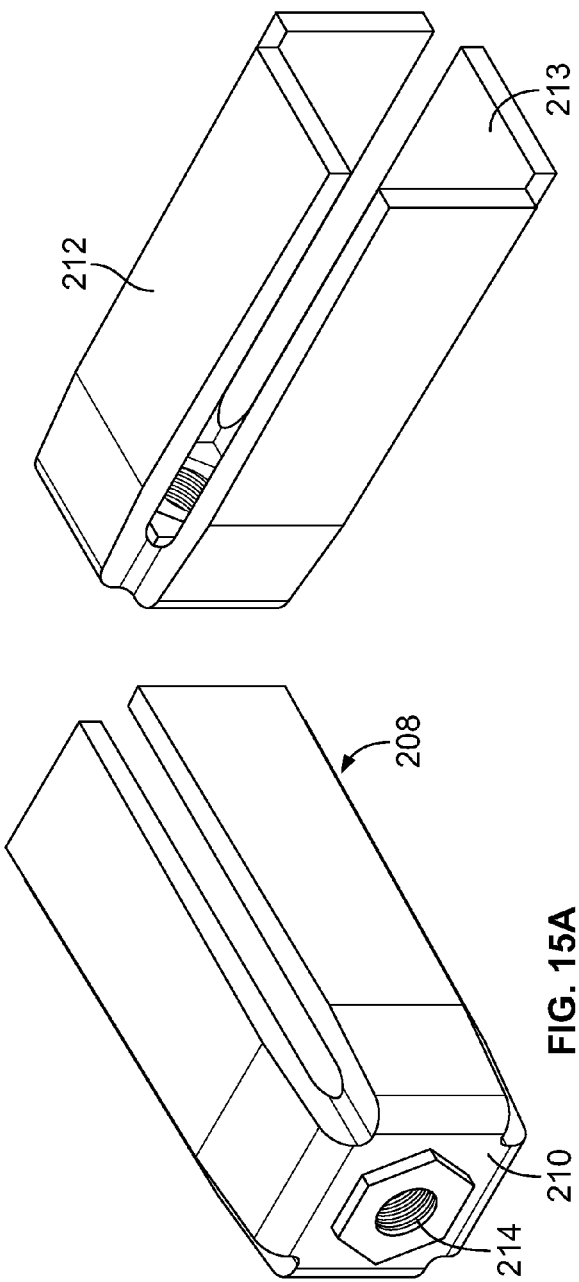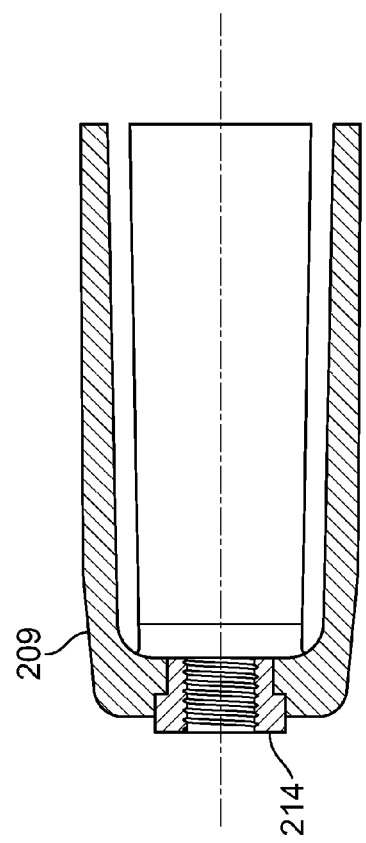
FIG. 15B
FIG. 15C
FIG. 15A

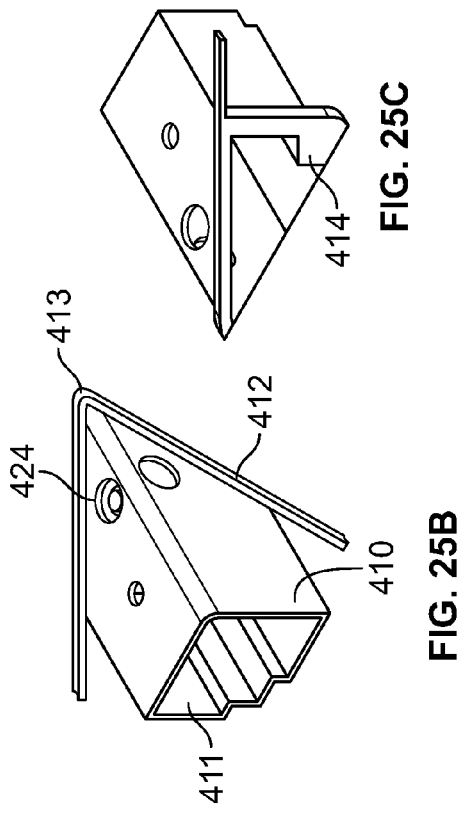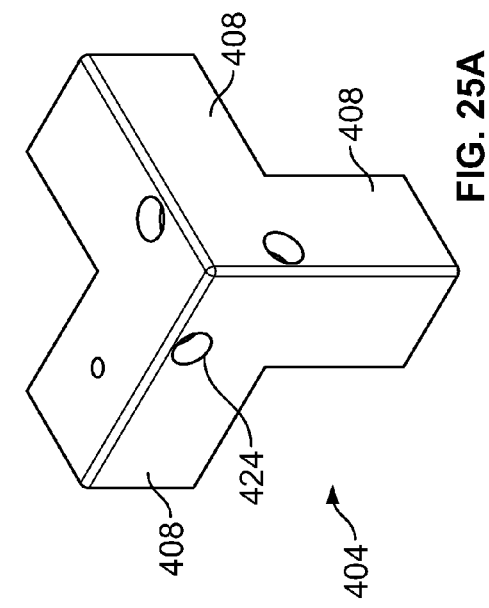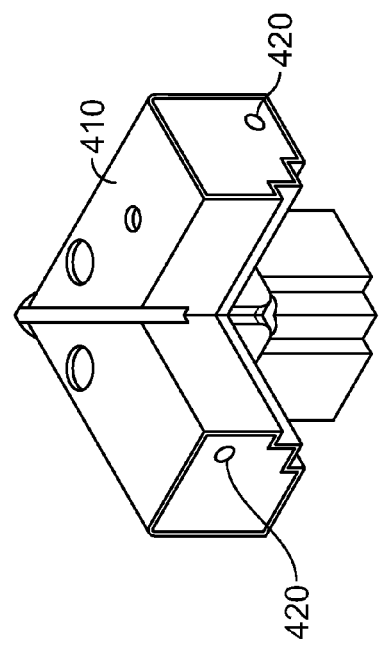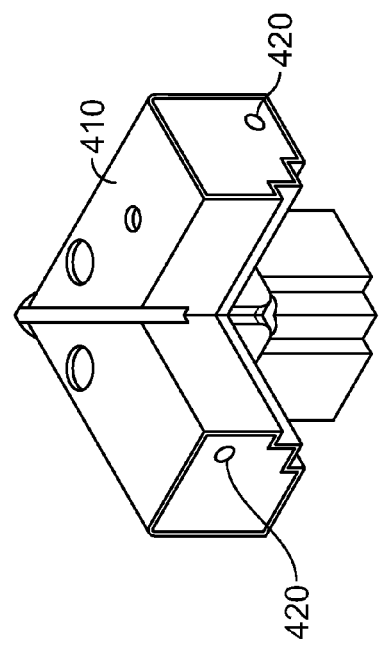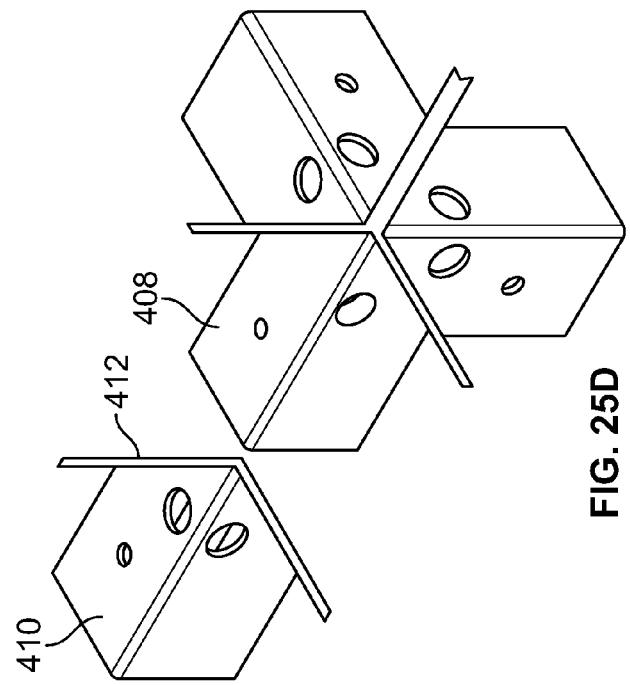

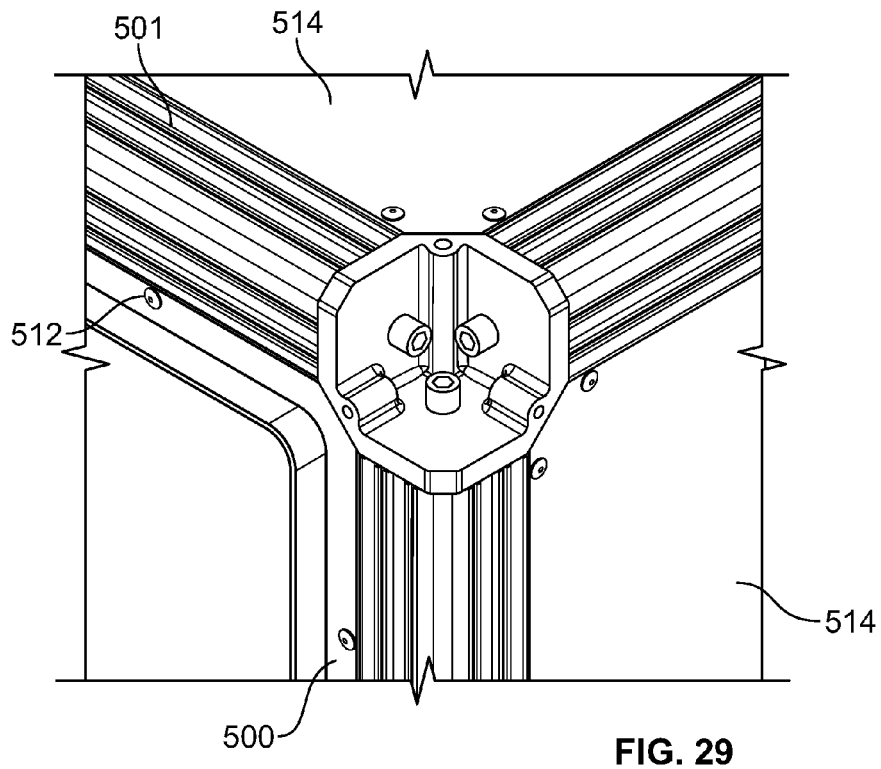
FIG. 29
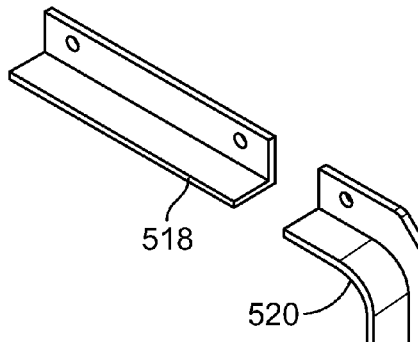
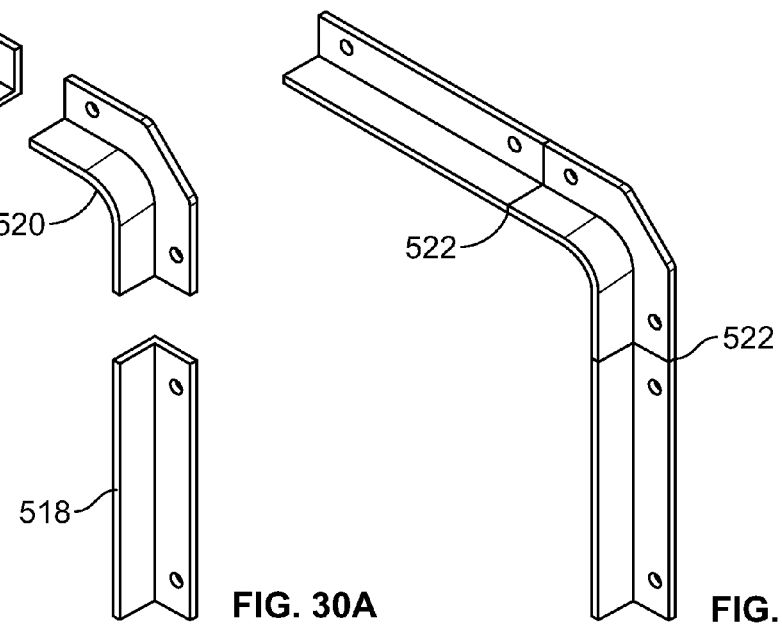
FIG. 30A
FIG. 30B

US 9,549,482 B2

CABINET FRAME ENCLOSURES, FRAME MEMBERS AND CORRESPONDING METHODS

CROSS-REFERENCE TO RELATED APPLICATIONS

This application is a continuation of U.S. patent application Ser. No. 14/732,261 filed Jun. 5, 2015, which claims the benefit of U.S. Provisional Application No. 62/046,567 filed Sep. 5, 2014. The entire disclosures of each of the above applications are incorporated herein by reference.

FIELD

The present disclosure relates to cabinet frame enclosures, frame members and methods for assembling cabinet frame enclosures.

BACKGROUND

This section provides background information related to the present disclosure which is not necessarily prior art.

Electronic equipment cabinets may be used to enclose electronic components and protect the electronic components from water, dirt, other contaminants, etc. The cabinets may include frames, panels, doors, etc. to enclose the electronic components, and may be shaped, sized, etc. to accommodate different sized electronic components, different numbers of electronic components, etc.

SUMMARY

This section provides a general summary of the disclosure, and is not a comprehensive disclosure of its full scope or all of its features.

According to one aspect of the present disclosure, an electrical equipment cabinet generally includes multiple frame members defining four sides, a top, and a bottom of the cabinet. Each frame member includes an external portion defining at least one channel and having at least one surface. The cabinet also includes multiple corner copulas positioned between the frame members for coupling adjacent frame members. Each frame member has a same cross-sectional profile.

According to another aspect of the present disclosure, an electrical equipment cabinet generally includes multiple frame members defining four sides, a top, and a bottom of the cabinet. Each frame member includes an external portion defining multiple channels and having multiple surfaces. The cabinet also includes multiple corner copulas positioned between the frame members for coupling adjacent frame members. The multiple channels of each frame member include a rivet slot configured to receive a rivet or a bulb gasket, a pocket configured to receive a snap member of a frame member cover, and a nut slot configured to receive a nut for coupling a door hinge to the frame member. The multiple surfaces of each frame member include a gasket surface configured to receive a gasket and a stop surface configured to align a panel or a door frame coupled to the frame member.

According to yet another aspect of the present disclosure, a method of constructing an electrical equipment cabinet is disclosed. The method includes coupling a plurality frame of members together by coupling corner copulas between adjacent frame members to define four sides, a top, and a bottom of the cabinet. Each frame member includes an external portion defining multiple channels and multiple surfaces and each frame member has a same cross-sectional profile. The method also includes coupling one or more external components to the external portions of four adjacent frame members.

According to another aspect of the present disclosure, an electrical equipment cabinet includes frame members defining fours sides, a top, and a bottom of the cabinet. Each frame member includes an external side and internal side. The internal sides of at least two of the frame members each define at least one channel and a corresponding mounting surface. The cabinet also includes an internal component positioned against the mounting surfaces and coupled to the corresponding channels of each of the at least two frame members.

According to another aspect of the present disclosure, a method of constructing an electrical equipment cabinet is disclosed. The method includes coupling a plurality frame members together by coupling corner copulas between adjacent frame members to define four sides, a top, and a bottom of the cabinet. At least two of the frame members each include an internal side having a channel and a corresponding mounting surface. The method also includes positioning an internal component against the mounting surfaces of each of the at least two frame members, and coupling the internal component to the corresponding channels of the at least two frame members.

According to another aspect of the present disclosure, an electrical equipment cabinet includes frame members defining four sides, a top, and a bottom of the cabinet. Each frame member includes an end defining an opening. The cabinet also includes a wedge defining an opening. The wedge is configured to create a friction fit when the wedge is positioned in one of the openings of one of the frame members. The cabinet further includes a corner copula having a wall and a prong extending from wall. The prong is configured to create a friction fit when the prong is positioned in the opening of the wedge. The wedge includes at least two separate arms to enhance the friction fit between the frame member opening, the wedge and the corner copula prong.

According to another aspect of the present disclosure, a method of coupling a frame member of an electrical equipment cabinet to a corner copula using a wedge is disclosed. The frame member defines an opening at an end of the frame member, the wedge has at least two separate arms defining an opening of the wedge, and the corner copula has a prong extending from a wall of the corner copula. The method includes inserting the wedge into the opening of the frame member to couple the wedge to the frame member via a friction fit, and inserting the prong of the corner copula into the opening of the wedge to couple the corner copula to the wedge via a friction fit. The at least two separate arms of the wedge enhance the friction fit between the frame member, the wedge and the corner copula.

According to yet another aspect of the present disclosure, an electrical equipment cabinet including frame members defining four sides, a top, and a bottom of the cabinet. At least one of the frame members includes interior walls defining an opening at an end of the frame member and a connecting rib extending between opposite interior walls or between opposite interior corners defined by adjacent interior walls. The connecting rib includes a central boss structure having threads. The cabinet also includes a corner copula having a wall and at least two separated prongs extending from the wall to define a central channel. The at least two prongs extend into the opening of the at least one frame member to create a friction fit therebetween. The cabinet further includes a fastener extending through the central channel and into the central boss structure to couple the corner copula to the at least one frame member.

According to another aspect of the present disclosure, a method of constructing an electrical equipment cabinet is disclosed. The cabinet includes at least one frame member and at least one corner copula. The frame member has interior walls defining an opening and a connecting rib extending between the interior walls and having a central boss structure. The corner copula has a wall with at least two separate prongs extending from the wall to define a central channel between the prongs. The method includes inserting the at least two prongs into the opening of the frame member to create a friction fit between the prongs and the interior walls of the frame member, and inserting a fastener through a hole in the wall of the corner copula, through the central channel of the corner copula and into the central boss structure to couple the corner copula to the frame member.

According to yet another aspect of the present disclosure, an electrical equipment cabinet includes a corner copula having a central portion and three protruding members extending from a central portion of the corner copula. The cabinet also includes sleeve gaskets. Each sleeve gasket is positioned about a corresponding one of the three protruding members and a portion of the corner copula adjacent said one of the three protruding members. Each sleeve gasket includes sleeve gasket walls defining an opening at each end. Two of the sleeve gasket walls extend at an angle to a sleeve gasket point. The cabinet also includes three frame members. Each frame member has a first end positioned about a corresponding one of the sleeve gaskets to create a friction fit with the sleeve gasket. Each frame member includes frame member walls defining an opening at each end, with two of the frame member walls extending at an angle to a frame member point aligned with the sleeve gasket point of the corresponding sleeve gasket.

According to another aspect of the present disclosure, a method of constructing an electrical equipment cabinet is disclosed. The method includes positioning a first sleeve gasket about a protruding member of a first corner copula to create a friction fit between the first gasket sleeve and the protruding member of the first corner copula, and positioning a second sleeve gasket about a protruding member of a second corner copula to create a friction fit between the second gasket sleeve and the protruding member of the second corner copula. The method also includes positioning an opening at a first end of a frame member about the first gasket sleeve to create a friction fit between the first gasket sleeve and the opening at the first end of the frame member, and positioning an opening at a second end of the frame member about the second gasket sleeve to create a friction fit between the second gasket sleeve and the opening at the second end of the frame member, thereby coupling the frame member between the first corner copula and the second corner copula.

According to yet another aspect of the present disclosure, an electrical equipment cabinet includes frame members defining four sides, a top, and a bottom of the cabinet. The cabinet also includes a substantially continuous door gasket frame defining a perimeter corresponding to a perimeter of one of the sides of the cabinet. The substantially continuous door gasket frame includes a mounting flange and a sealing flange extending from the mounting flange. The mounting flange is coupled to four adjacent frame members, and the sealing flange is configured to receive or compress a gasket.

According to another aspect of the present disclosure, a method of coupling a substantially continuous door gasket frame to an electrical equipment cabinet is disclosed. The electrical equipment cabinet includes frame members defining four sides, a top, and a bottom of the cabinet. The method includes forming a mounting flange and a sealing flange of a substantially continuous door gasket frame, shaping a perimeter of the substantially continuous door gasket frame to correspond to a perimeter of one of the sides of the cabinet, and coupling the mounting flange to four adjacent frame members.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIGS. 15A and 15B are perspective views of a wedge of FIG. 14.

FIG. 15C is a cross-sectional view of the wedge of FIGS. 15A and 15B.

Figure 24:
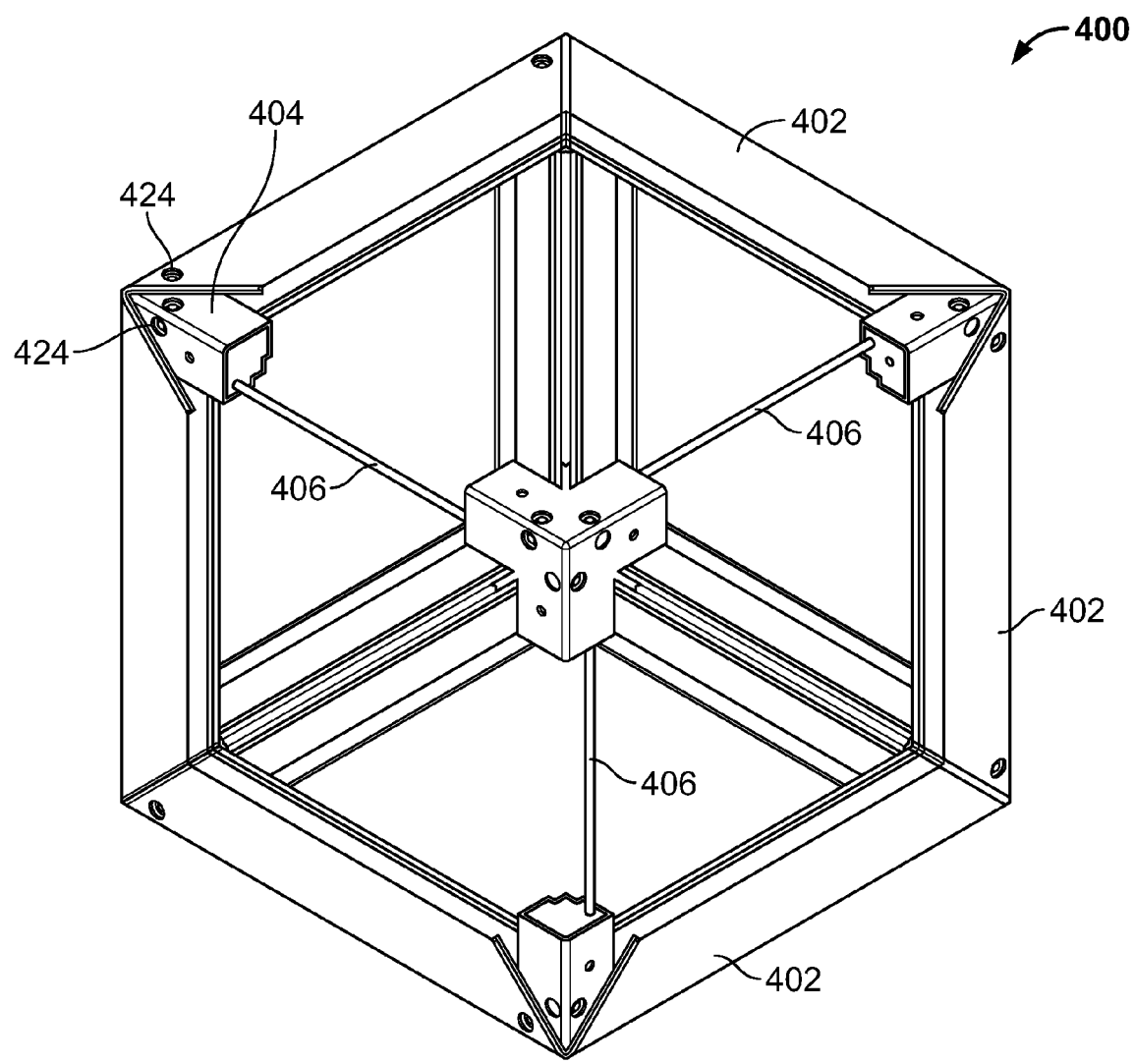
FIG. 24 is a perspective view of a cabinet frame according to another example embodiment.

FIGS. 25A-E are perspective views of sleeve gaskets and corner copulas of FIG. 24.

Figure 26A:
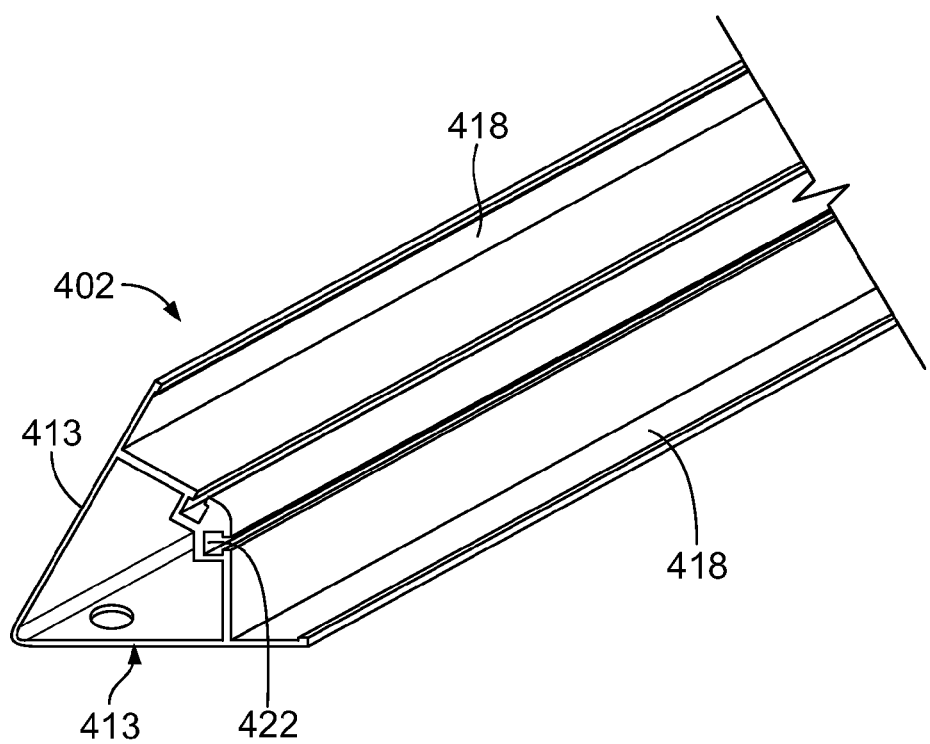

FIG. 26A is a perspective view of a frame member of the cabinet frame of FIG. 24.

Figure 26B:
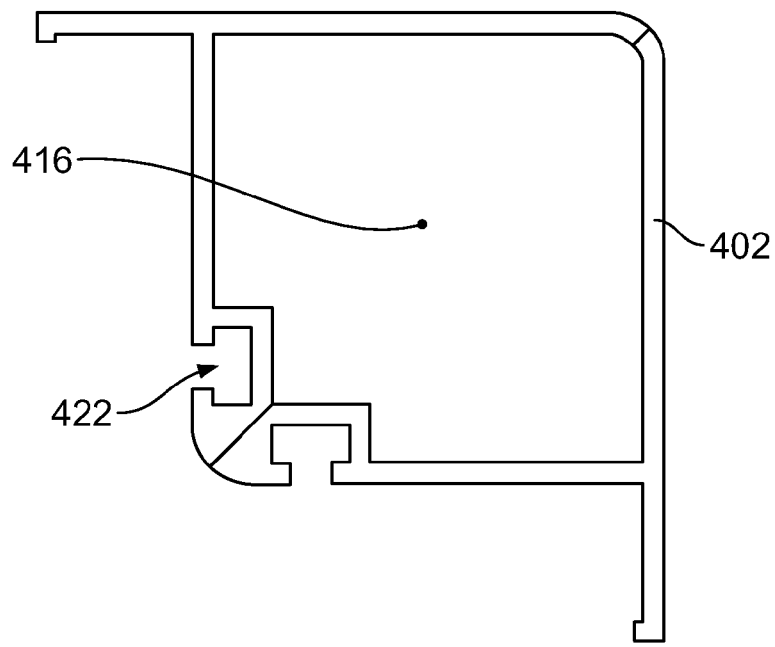

FIG. 26B is a cross-sectional view of the frame member of FIG. 26A.

Figure 23:
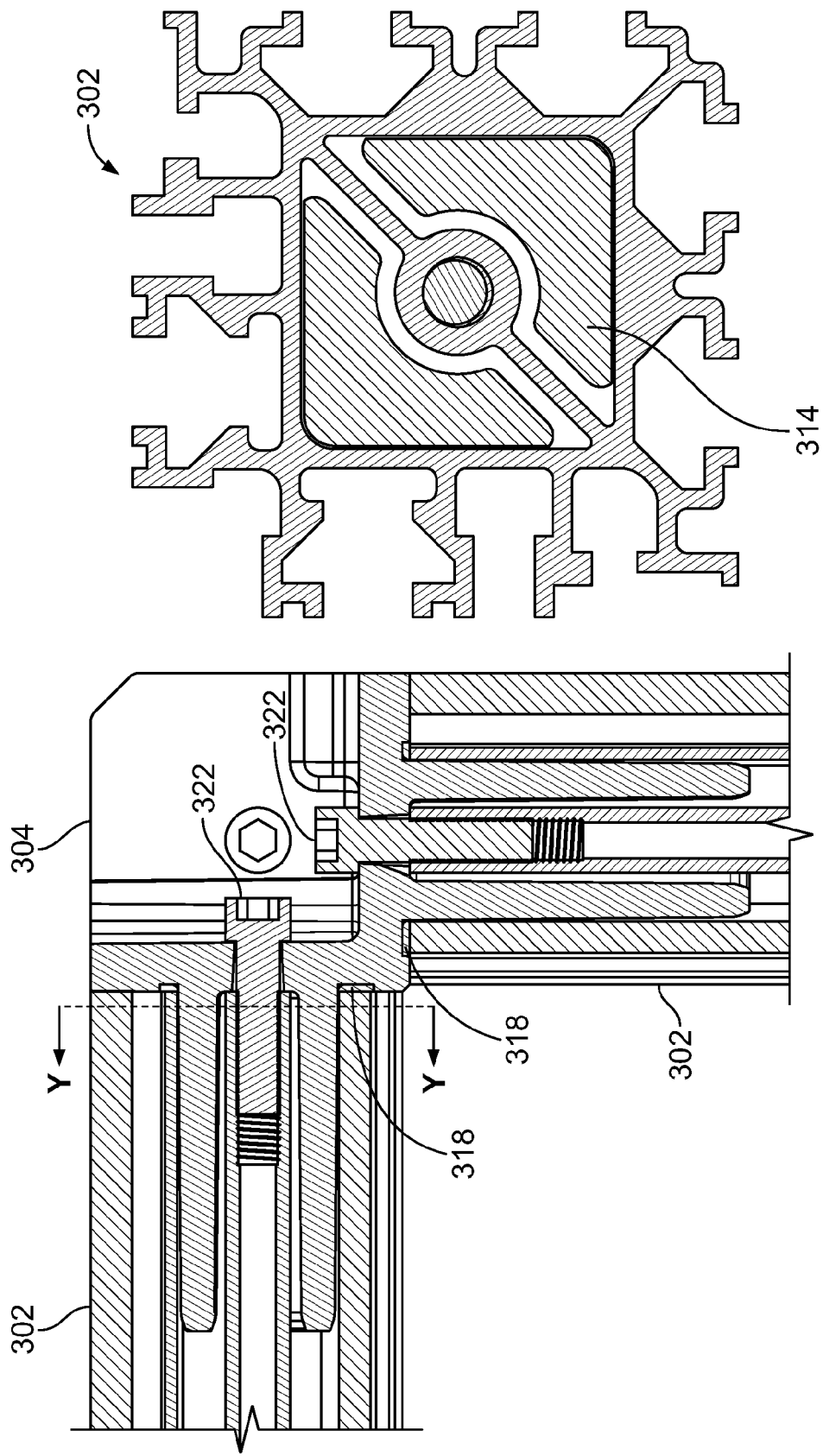
FIG. 23A is a cross-sectional view of the corner copula of FIG. 19 coupled to two frame members via prongs.
FIG. 23B is a cross-sectional view of prongs of a corner copula inserted into an opening of a frame member.
Figure 27:
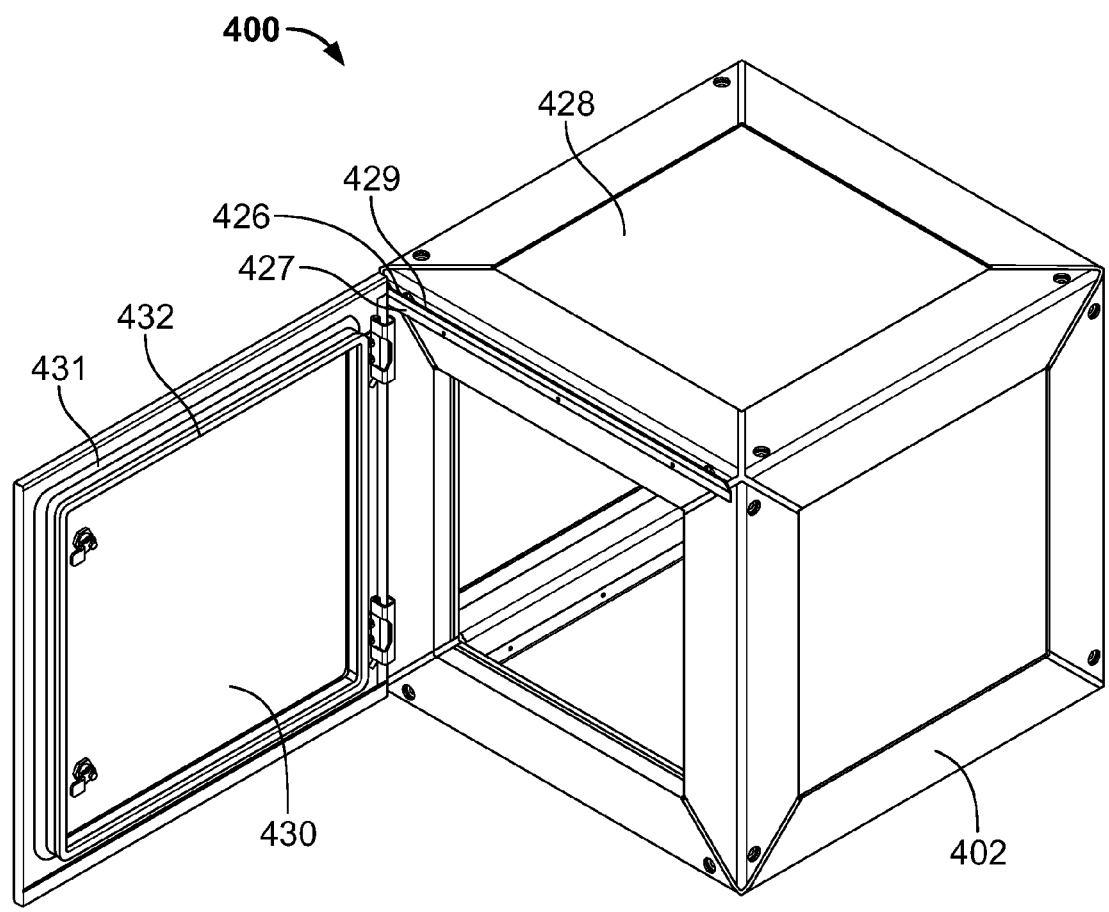

FIG. 27 is a perspective view of the cabinet frame of FIG. 23, including panels, a water diverter, a door and a door gasket frame.

Figure 28:
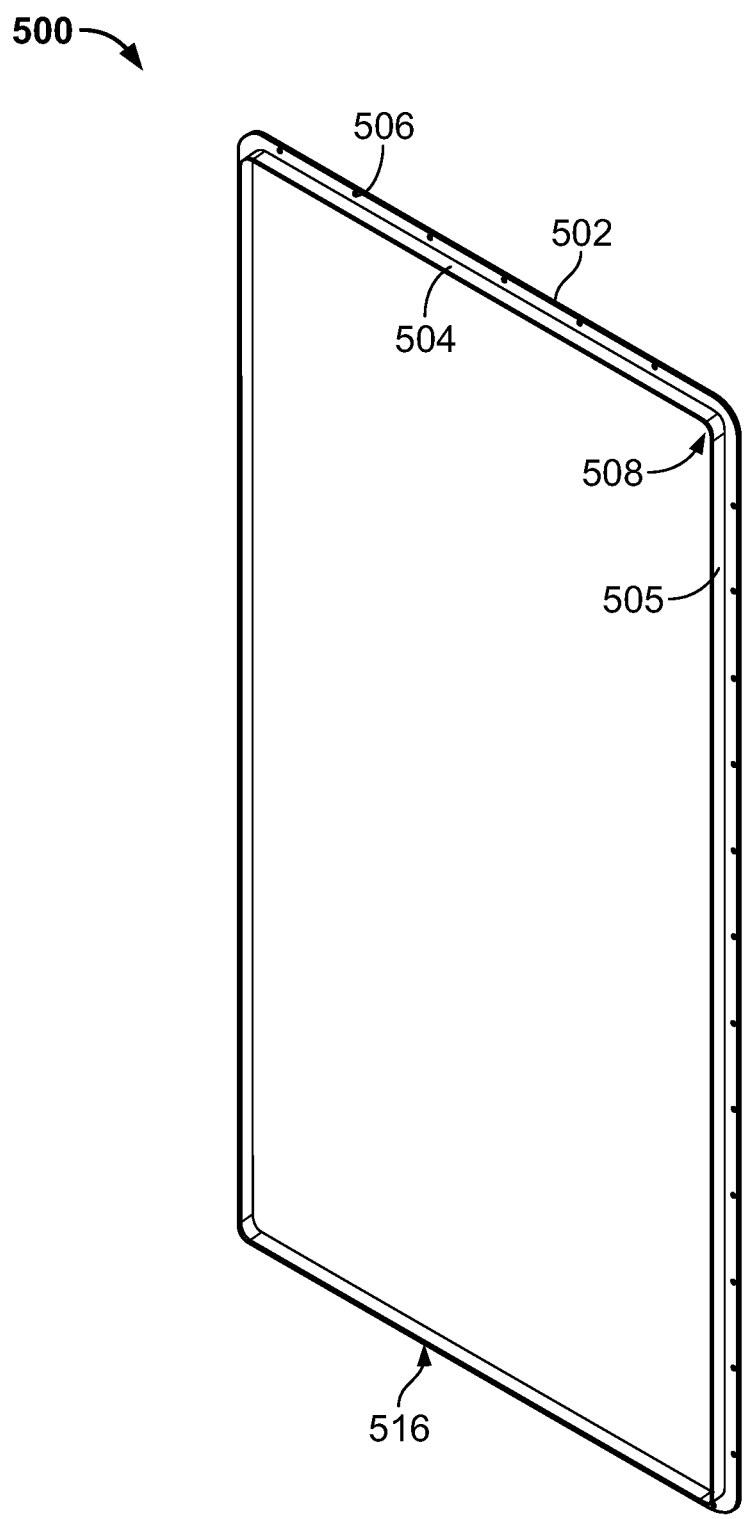

FIG. 28 is a perspective view of a door gasket frame according to another example embodiment.

FIG. 29 is a perspective view of a portion of a cabinet including the door gasket frame of FIG. 28.

FIGS. 30A and 30B are perspective views of a door gasket frame according to another example embodiment.

Corresponding reference numerals indicate corresponding features throughout the several views of the drawings.

DETAILED DESCRIPTION

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Figure 1:
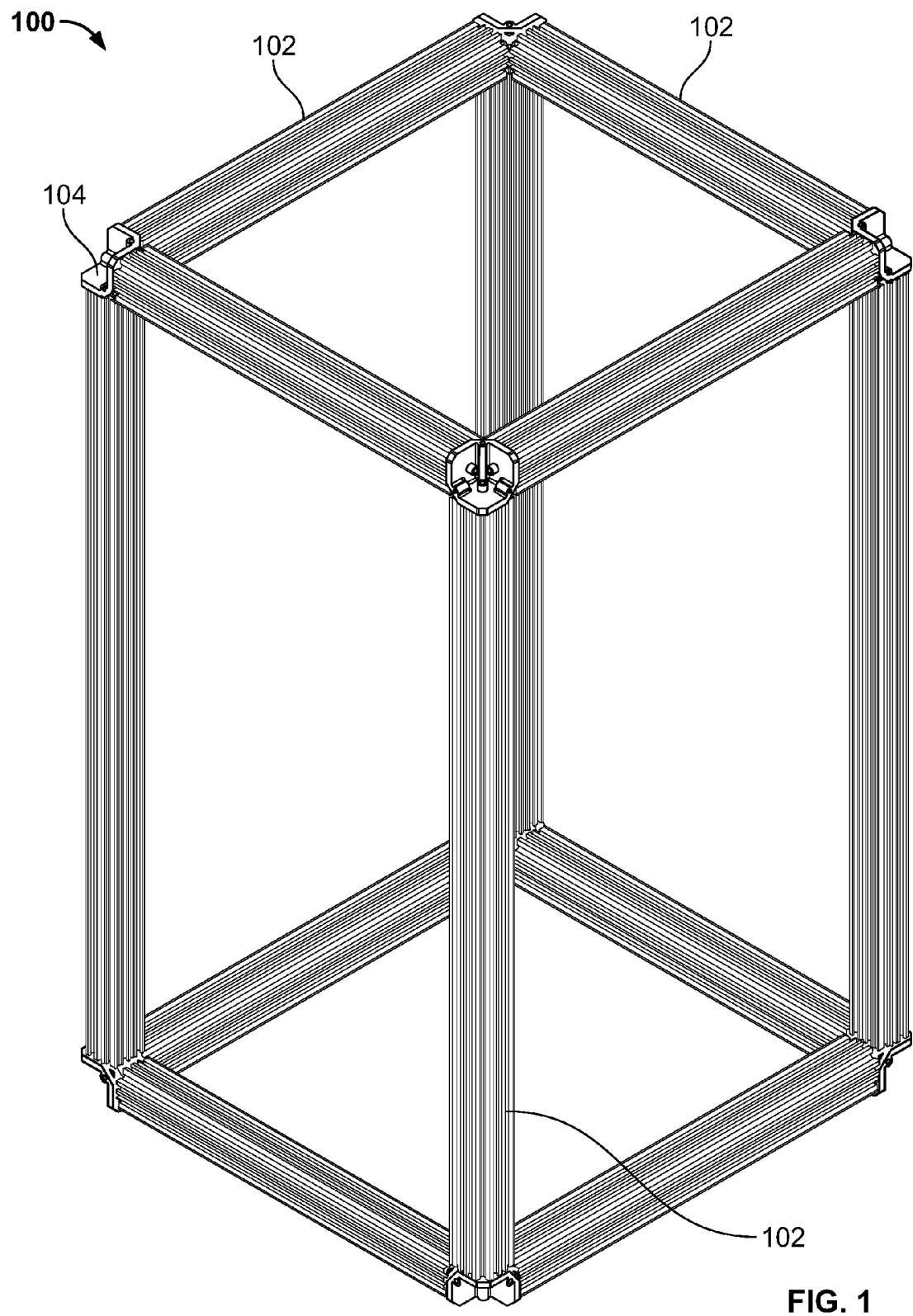
FIG. 1 is a perspective view of an example cabinet frame according to one embodiment of the present disclosure.

A cabinet frame for an electrical equipment cabinet according to one example embodiment of the present disclosure is illustrated in FIG. 1 and indicated generally by reference number 100. As shown in FIG. 1, the cabinet frame 100 generally includes frame members 102 defining four sides, a top, and a bottom of the cabinet. In the example of FIG. 1, the frame 100 includes twelve frame members 102, with four of the frame members comprising vertical frame members, and eight of the frame members comprising horizontal frame members, thereby defining a substantially rectangular cabinet frame shape. Each frame member 102 includes an external side (e.g., a side of the frame member facing outward from the cabinet, external portion, etc.) and an internal side (e.g., a side of the frame member facing inward to the cabinet, an internal portion, etc.).

Other embodiments may include more or less frame members 102, different configurations of the frame members, more or less cabinet sides (e.g., a single side, three sides, six sides, etc.), other cabinet shapes (e.g., triangular, circular, etc.), may not include a top, may not include a bottom, etc.

The cabinet frame 100 also includes corner copulas 104 positioned between the frame members 102. The corner copulas may couple the frame members 102 to each other using any suitable fasteners, coupling hardware, structure, mechanism, friction fit, compression fit, etc. As shown in FIG. 1, the cabinet frame 100 includes eight corner copulas 104 with each corner copula connecting three adjacent frame members 102, but other embodiments may include more or less corner copulas (e.g., four corner copulas, twelve corner copulas, etc.) and each corner copula may connect more or less frame members (e.g., connect only two frame members, connect four frame members, etc.). The corner copulas 104 are coupled to corresponding ends of the frame members 102 in FIG. 1. Other embodiments may include corner copulas coupled to other portions of a frame member (e.g., a central portion of the frame member, etc.).

Figure 2:
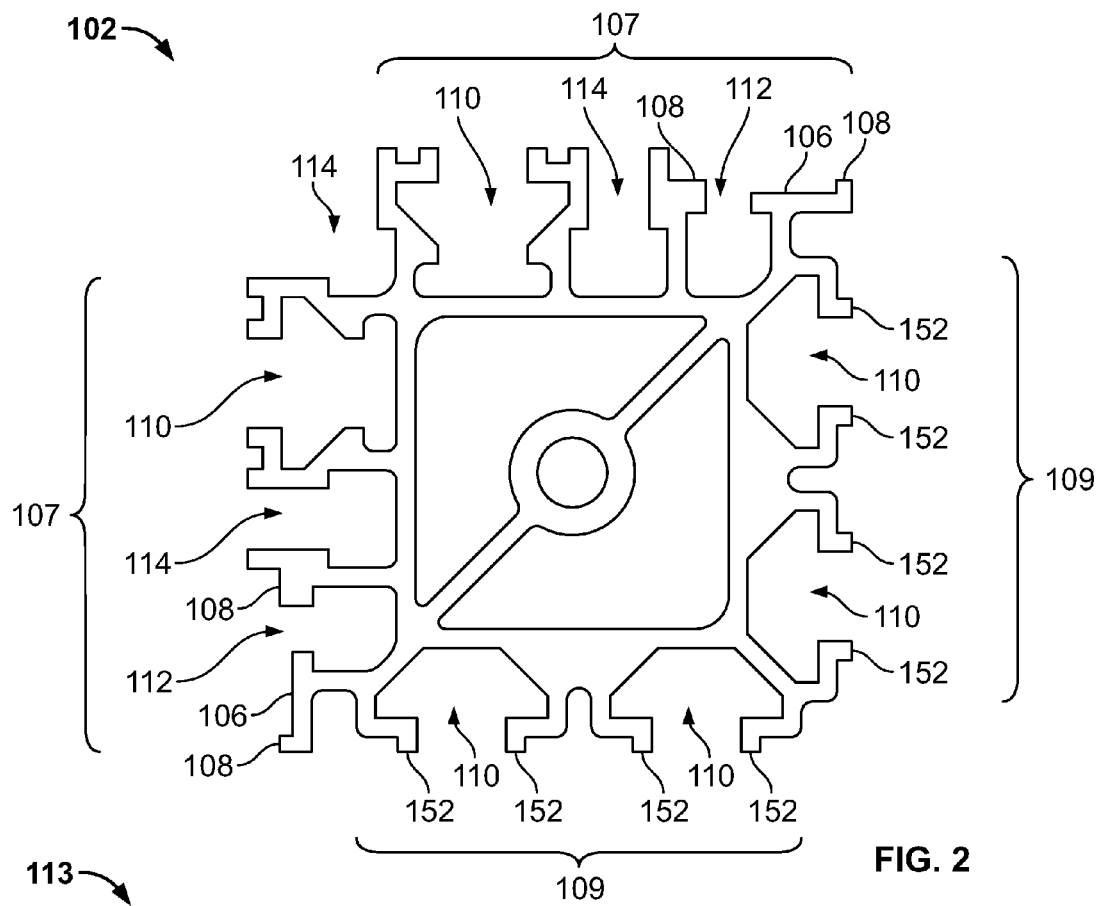
FIG. 2 is an end view of a frame member of FIG. 1, showing a profile of the frame member.

FIG. 2 illustrates an end view of one frame member 102 of the cabinet frame 100 of FIG. 1. The frame member 102 includes two external cabinet sides 107 (e.g., external portions, etc.), and two internal cabinet sides 109 (e.g., internal portions, etc.). Each external side 107 defines multiple channels and includes multiple surfaces, and each internal side 109 defines multiple channels and includes multiple surfaces (explained below), which may be substantially different from the channels and/or surfaces of the external sides, may be substantially the same as the channels and/or surfaces of the external sides, may include some similar channels and/or surfaces together with some different channels and/or surfaces, etc.

FIG. 2 also illustrates the frame member 102 having a generally rectangular cross-section with four sides including two external sides 107 and two internal sides 109. Other embodiments may include frame members 102 having more or less sides, more or less external sides 107, more or less internal sides 109, other shapes (e.g., circular, triangular, etc.). The external sides 107 and/or internal sides 109 may be substantially perpendicular with each other, may have different angles relative to one another, etc.

Figure 3:
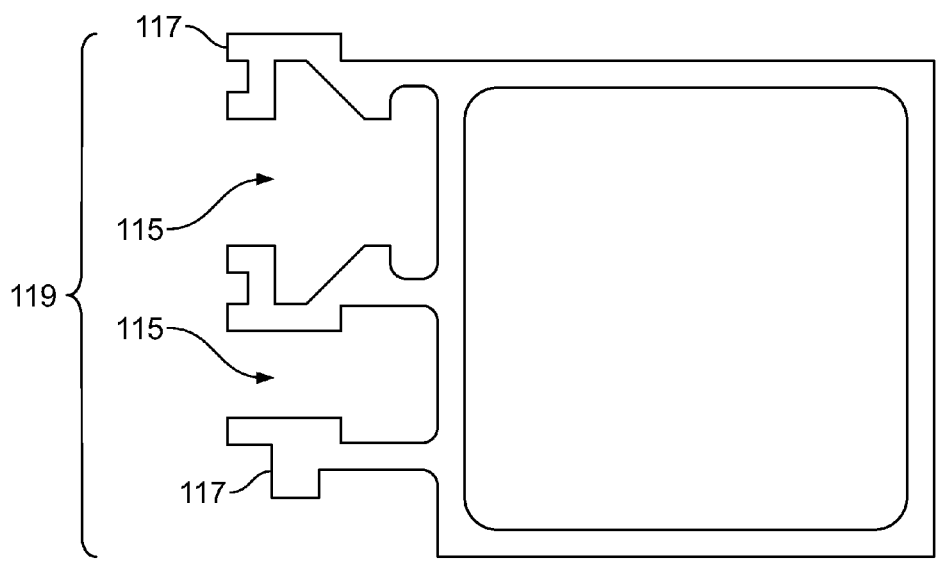
FIG. 3 is an end view of another example frame member having multiple channels and multiple surfaces on one external side.

For example, FIG. 3 illustrates another example frame member 113 defining multiple channels 115 and multiple surfaces 117. In contrast to the frame member 102 of FIG. 2, the frame member 113 of FIG. 3 includes channels 115 and surfaces 117 only on one external side 119 of the frame member 113. Although FIG. 3 illustrates specific channel 115 and surface 117 shapes, positions, sizes, etc., other embodiments may define any suitable channel shapes, positions, sizes, etc. and may include any suitable surface shapes, positions, sizes, etc.

Referring again to FIG. 2, in some embodiments, all frame members 102 of cabinet frame 100 may have a same cross-sectional profile, allowing the frame members to be used interchangeably at any suitable location of the cabinet frame. Having a same cross-sectional profile may allow for a single frame member design to be manufactured and then individual frame members can be cut at desired lengths from the single frame member design to be used for all frame members 102 of the cabinet frame 100. This may reduce the need to produce frame members having different cross-sectional profiles, have different part numbers for different profile frame members, etc.

The frame member 102 may include a surface 106 (e.g., a strip gasket surface, etc.) to allow a gasket (e.g., strip gasket, etc.) to be placed against the frame member to create a seal for a panel, other external component, etc.

The frame member 102 may include a surface 108 (e.g., stop surface, rib, positive stop, etc.) for supporting, aligning etc. external panels, door frames, other components, etc. that may be coupled to the cabinet frame 100. For example, the surface 108 may provide a support surface for panels, door gasket frames, etc., being mounted (e.g., riveted, etc.) to the cabinet frame 100.

The surface 108 may assist in aligning a panel prior to mounting the panel to the cabinet frame, thereby making it easier to line up the panel prior to mounting. The surface 108 may allow for simple placement of the panel against the stop surface 108 for faster assembly of an electrical equipment cabinet.

As shown in FIG. 2, the frame member 102 may include a slot 110 (e.g., a nut slot, etc.) for receiving hardware, fasteners, etc. to attach door hinges (and/or other components) to the cabinet frame 100. For example, a receiver (e.g., a nut, T-Nut, fastener receiver, etc.) may be inserted into the slot 110 and a door hinge may then be attached to the frame member 102 by inserting a screw, bolt, etc. into the receiver positioned in the slot 110. This slot 110 may provide for faster assembly of an electrical equipment cabinet because a receiver can be inserted into the slot 110, moved directly to the desired location, and a fastener can be inserted to couple a panel, a door hinge, etc. to the cabinet frame 100. This may not require any holes to be drilled, may allow assembly that only requires access to external sides 107 of a frame member, may allow for quickly sliding the receiver to any desired location along the slot 110, etc.

The frame member 102 may include a slot 112 (e.g., rivet slot, etc.) for receiving rivets or the like to mount panels, door gasket frames, other external cabinet components, etc. to the frame member 102. This process may allow external components to be added to the cabinet frame 100 without requiring secondary operations, such as drilling holes in the profile of the frame member 102, etc. For example, a panel (or other component) may be aligned with the slot 112 and a rivet may be inserted directly into the slot 112 to couple the panel to the frame member 102. The slot 112 may allow for insertion of the rivet at any desired location along the slot 112. This feature may assist in speeding up assembly of an electrical equipment cabinet. Alternatively, or in addition, the slot 112 may receive a bulb seal, which may be inserted directly into the slot 112 without requiring any other operations.

In the example of FIG. 2, the frame member 102 includes a pocket (e.g., catch, etc.) 114 to receive a cover for the frame member 102. For example, the pocket 114 may be configured to allow prongs (e.g., snap members, etc.) of a snap-on cover to be inserted into the pocket 114 when a frame member cover is attached to the frame member 102 to conceal some or all of the frame member as further explained below. This may assist in faster assembly of an electrical equipment cabinet because a cover can simply be snapped onto the frame member. The pocket 114 may not interfere with other components coupled to the frame member, so the cover can be mounted while after other components are already attached to the frame member 102. The cover may prevent water, dirt, other debris, etc. from entering the cabinet, the frame member 102, etc., which may protect components housed inside the cabinet.

Although FIG. 2 illustrates a specific number and configuration of frame member channels and surfaces, it should be apparent that other embodiments may include more or less channels and/or surfaces, different types of channels and/or surfaces, different configurations of the channels and/or surfaces, etc. For example, some embodiments may include more or less (or none) surfaces 106, surfaces 108, slots 110, slots 112, pockets 114, etc.

Figure 4B:
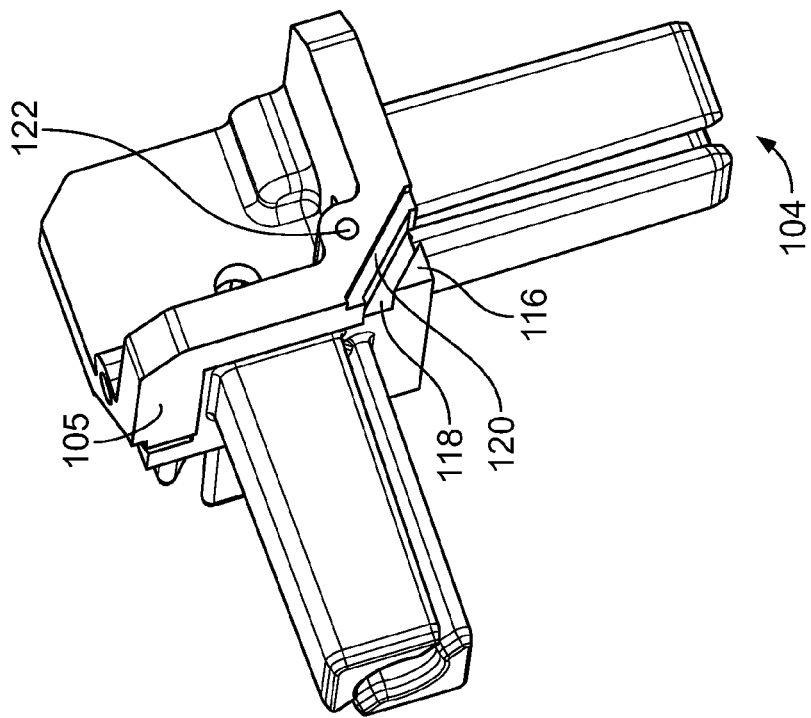
FIGS. 4A and 4B are perspective views of a corner copula of the cabinet frame of FIG. 1.
Figure 4A:
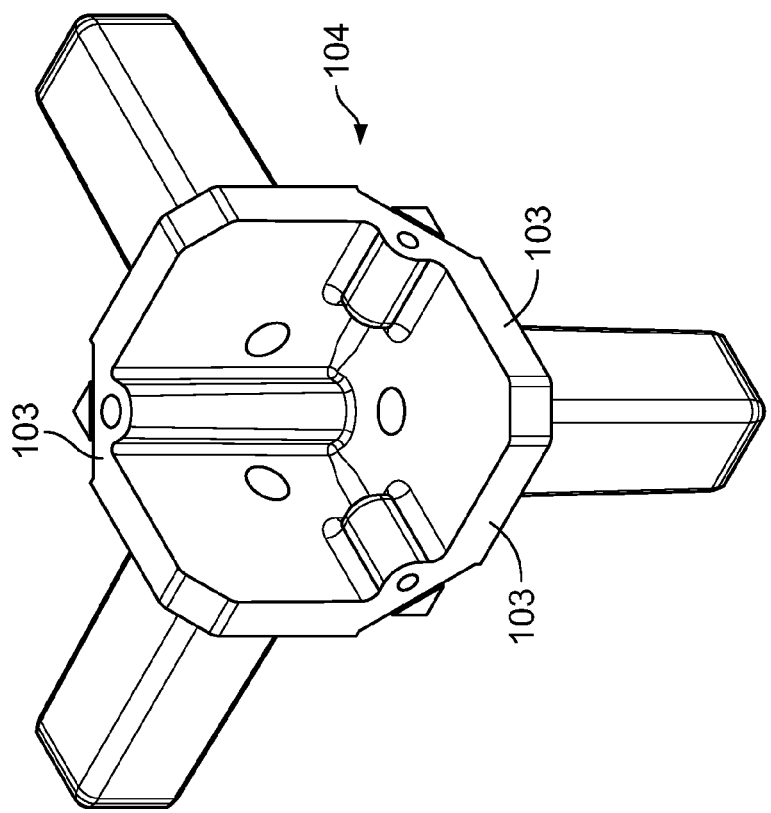

FIGS. 4A and 4B illustrate perspective views of one corner copula 104 of the cabinet frame 100 of FIG. 1. The corner copula 104 includes three external sides 103, and three internal sides 105, and is configured for mating with the frame members 102. Other example embodiments may include more or less external sides and more or less internal sides.

As shown in FIG. 4B, the corner copula 104 may include structure aligning with one or more of the multiple channels and/or surfaces of the frame members 102 to provide support for a panel, door frame, etc. mounted to the frame members. For example, one or more of the external sides 103 of the corner copula 104 may include a surface 116 for allowing a gasket (e.g., strip gasket, etc.) (not shown) to be placed against the copula. The surface 116 may align with the surface 106 of the frame member 102 (shown in FIG. 2) when the corner copula 104 is coupled to the frame member, thereby providing a continuous surface for placement of the strip gasket. Additionally, the corner copula 104 may include a pocket 118, which may align with slots 112 of the frame member 102 (shown in FIG. 2) when the corner copula is coupled to the frame member.

The corner copula 104 may also include a surface 120 for securing panels, gaskets, other external components, etc. by providing a support surface for such components, etc. The surface 120 may align with the surface 108 of the frame member 102 (shown in FIG. 2) when the corner copula 104 is coupled to the frame member 102.

As shown in FIG. 4B, the corner copula 104 may also include a mounting boss 122 to receive bolts, concealing covers, other external component assemblies, etc. For example, the mounting boss 122 may allow a copula cover or the like to be mounted to conceal the copula by inserting a plug, rivet, etc. through the copula cover and into the mounting boss 122 as further explained below.

Although FIG. 4B illustrates the corner copula 104 having specific structure (e.g., channels, surfaces, etc.) in a specific configuration, it should be apparent that other embodiments may include more or less channels and/or surfaces, different types of channels and/or surfaces, different configurations of channels and/or surfaces, etc. For example, the channels and/or surfaces of the corner copula 104 may have all, some, none, etc. dimensions corresponding to channels and/or surfaces of frame members 102 to which the corner copulas 104 are coupled.

Figure 5A:
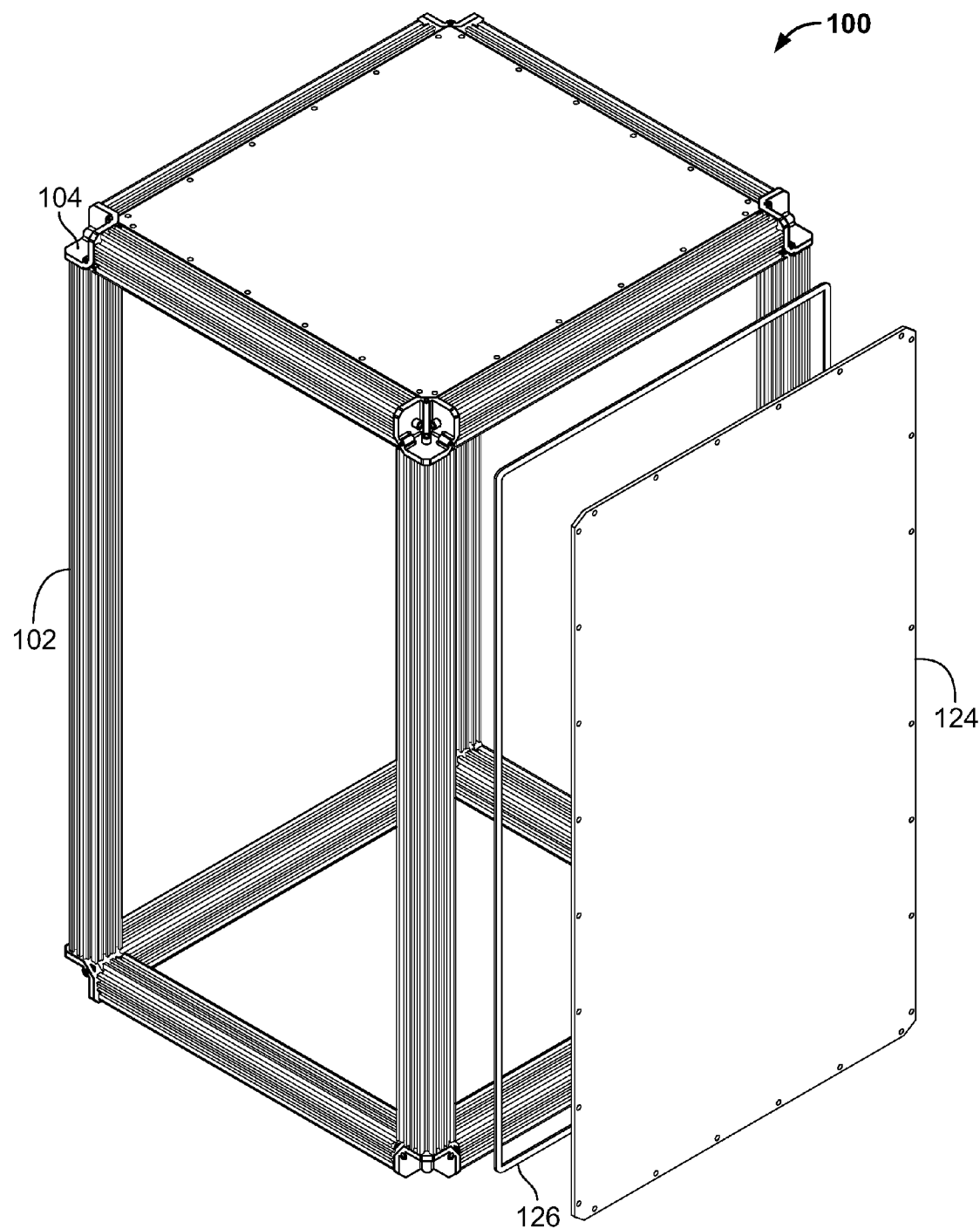
FIG. 5A is a perspective view of the cabinet frame of FIG. 1 including a panel and a strip gasket.
Figure 5B:
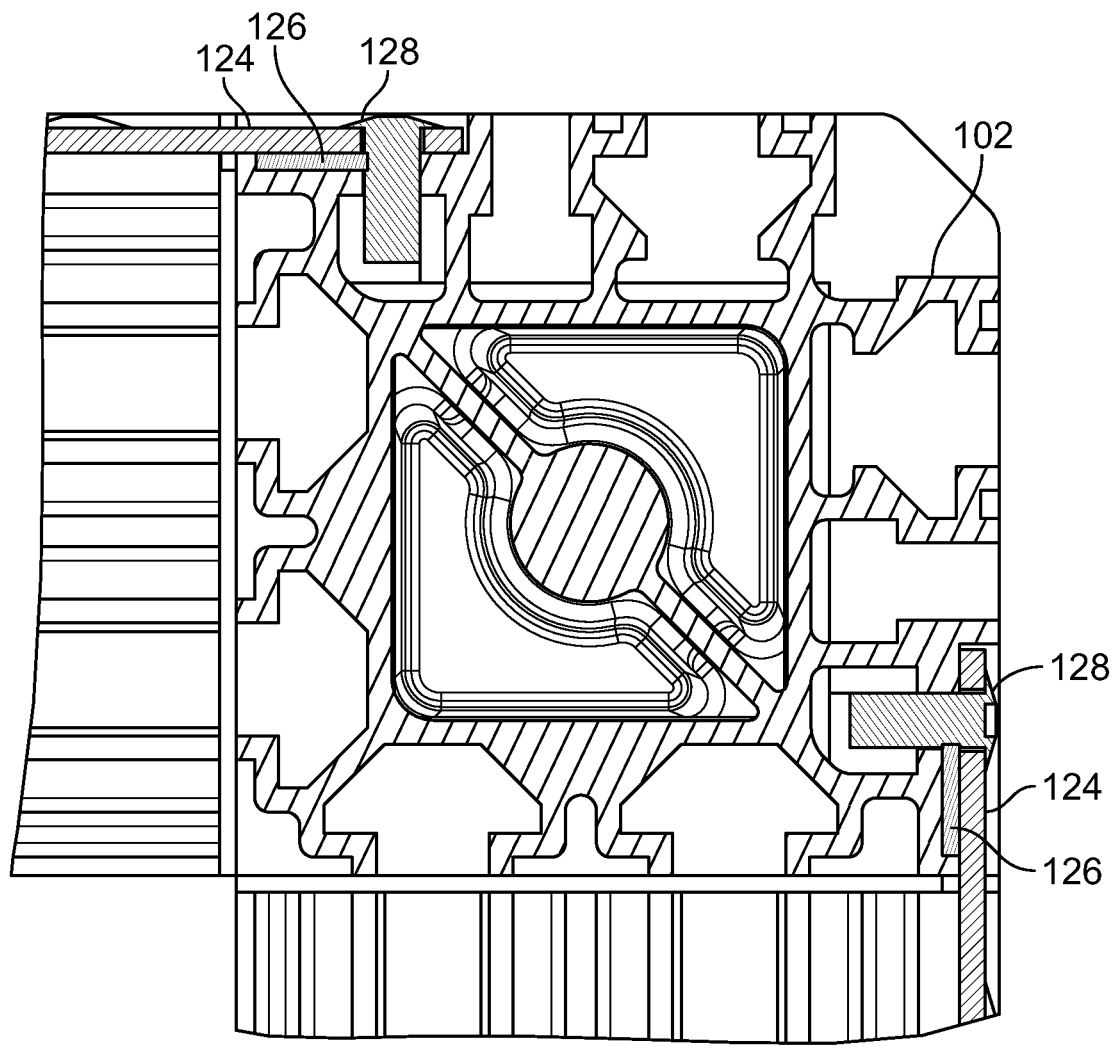
FIG. 5B is a section view of the cabinet frame of FIG. 5A showing the panel and strip gasket coupled to the frame.

FIG. 5A illustrates a perspective view of the cabinet frame 100 of FIG. 1 including a gasket 126 (e.g., a strip gasket, etc.) and a panel 124. As shown in FIG. 4, the gasket 126 extends around a perimeter of a side of the cabinet frame 100 and the panel 124 substantially covers this side. For example, the gasket 126 may be placed against the surface 106 (e.g., strip gasket surface, etc.) of selected frame members 102 (shown in FIG. 2) and the surface 116 of selected corner copulas 104 (shown in FIG. 3) as explained above. The panel 124 may then be placed over the gasket 126 and mounted, attached, coupled, etc. to the selected frame members 102 using rivets 128 and/or other suitable fasteners, which may be received by slots 112 (e.g., rivet slots, etc.) as explained above. FIG. 5B illustrates a cross-sectional view of a frame member 102 showing the panel 124 and gasket 126 coupled to the frame member via rivet 128.

Figure 6A:
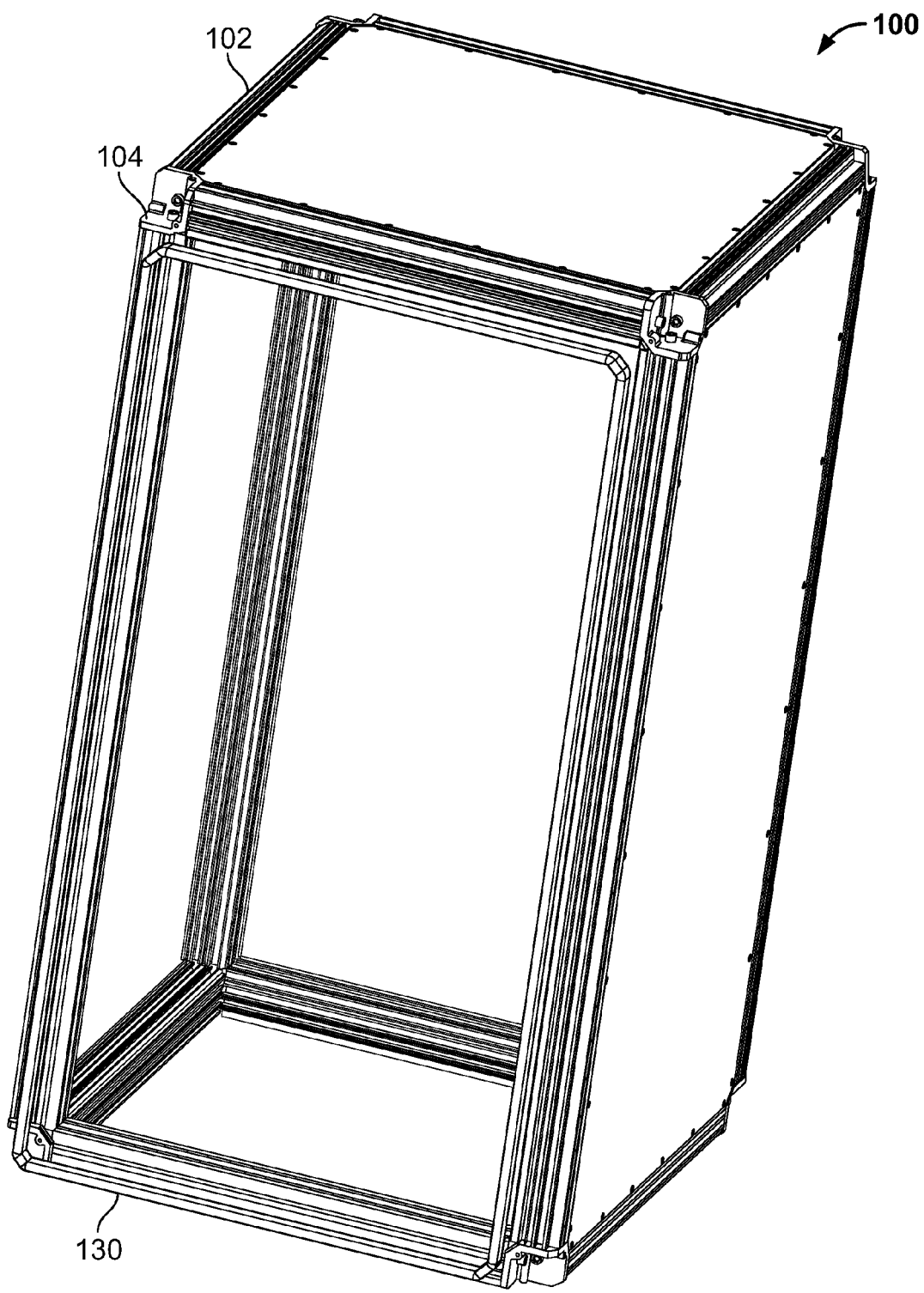
FIG. 6A is a perspective view of the cabinet frame of FIG. 5A including a bulb gasket.
Figure 6B:
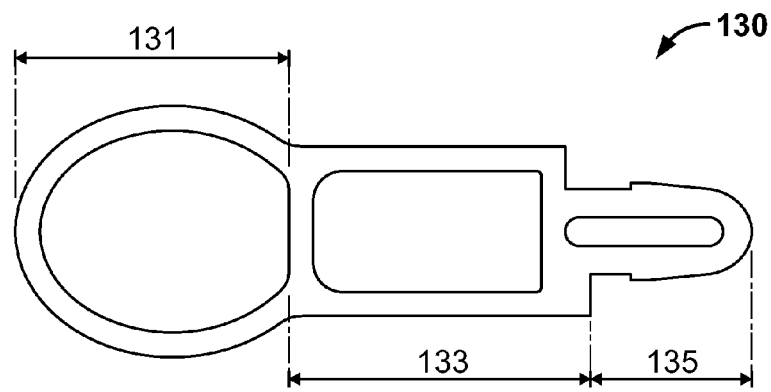
FIG. 6B is a cross-sectional view of the bulb gasket of FIG. 6A.
Figure 6C:
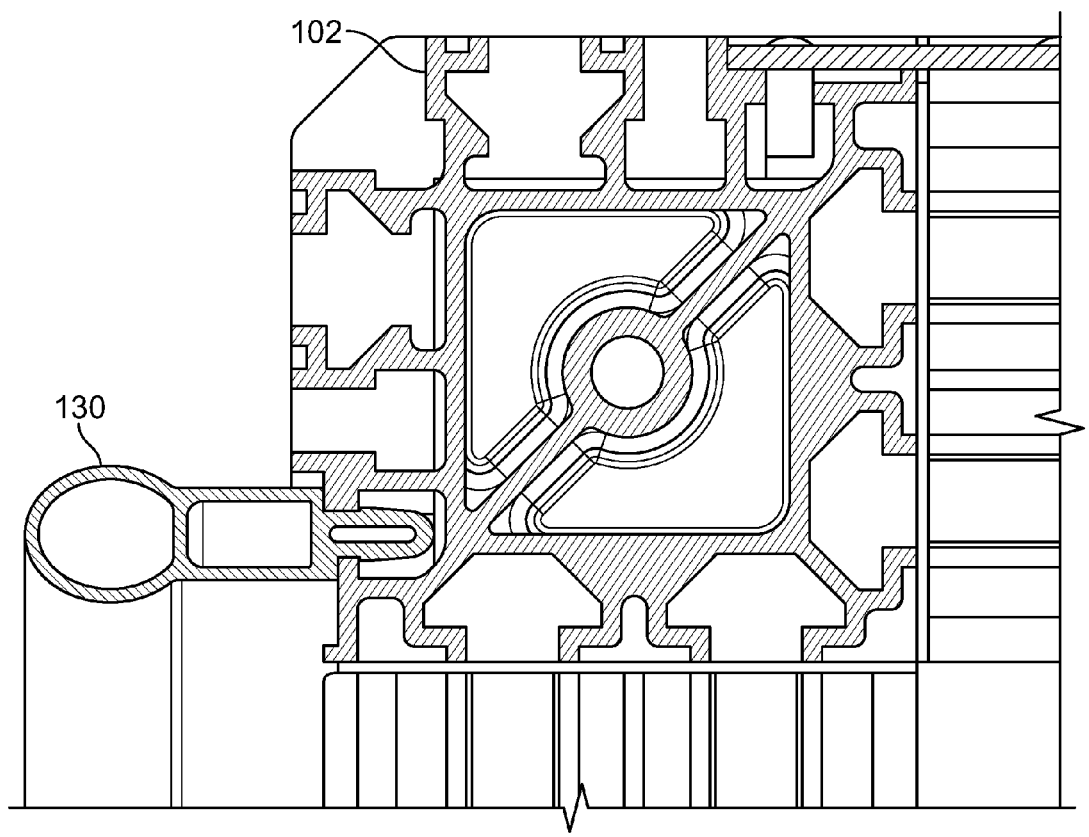
FIG. 6C is a cross-sectional view of a bulb gasket coupled to a frame member.

FIG. 6A is a perspective view of the cabinet frame 100 of FIG. 4 including a different gasket 130 (e.g., a bulb gasket, etc.). As shown in FIG. 6B, the gasket 130 may include a bulb section 131, a center support section 133, and a mounting section 135. The bulb gasket 130 may be mounted on the frame 100 by inserting the bulb gasket (e.g., the mounting section 135) into the slot 112 (e.g., rivet slot, etc.) of selected frame members 102 (shown in FIG. 2) and the pocket 118 of selected corner copulas 104 (shown in FIG. 3) as explained above. The bulb gasket 130 (or other gasket) may be used to provide a seal against a door coupled to the cabinet frame 100 (not shown in FIG. 5) while the door is in a closed position. FIG. 6C is a cross-sectional view of frame member 102 including a bulb seal 130 coupled to the frame member.

Figure 7A:
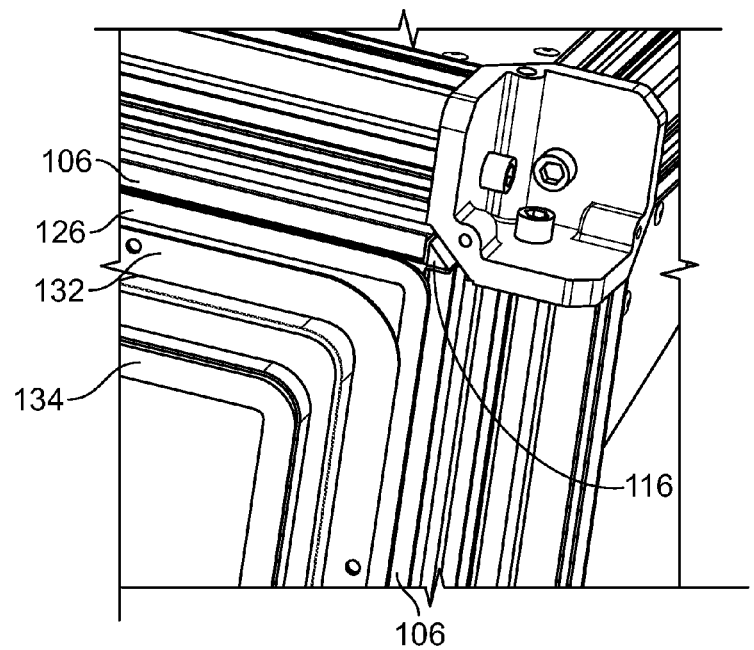
FIG. 7A is a perspective view of a portion of the cabinet frame of FIG. 1 including a door gasket frame.

FIG. 7A illustrates a perspective view of a portion of the cabinet frame 100 of FIG. 1 including a gasket 126, a door gasket frame 132, and a door gasket 134. Similar to FIG. 5A, the gasket 126 may be placed against the surface 106 of selected frame members 102 and the surface 116 of selected corner copulas 104 as explained above. The door gasket frame 132 may then be placed over the gasket 126 and mounted to the selected frame members 102 via rivets 128 or the like, which may be received in the slot 112 (shown in FIG. 2) as explained above. Accordingly, the strip gasket 126 may be used for coupling panels to a frame member 102, coupling a door gasket frame 132 to a frame member 102, etc.

The door gasket 134 may then be coupled to the door gasket frame 132. For example, the door gasket frame may include a flange and the door gasket 134 may be coupled to the flange of the door gasket frame 132, as shown in FIG. 6. The door gasket 132 may contact a back surface of a door coupled to the cabinet frame 100 when the door is in a closed position to inhibit water, dirt, other debris, etc. from entering the cabinet when the door is closed. Thus, the door gasket 132 may provide a similar role to the bulb gasket 130 in some embodiments.

Figure 7B:
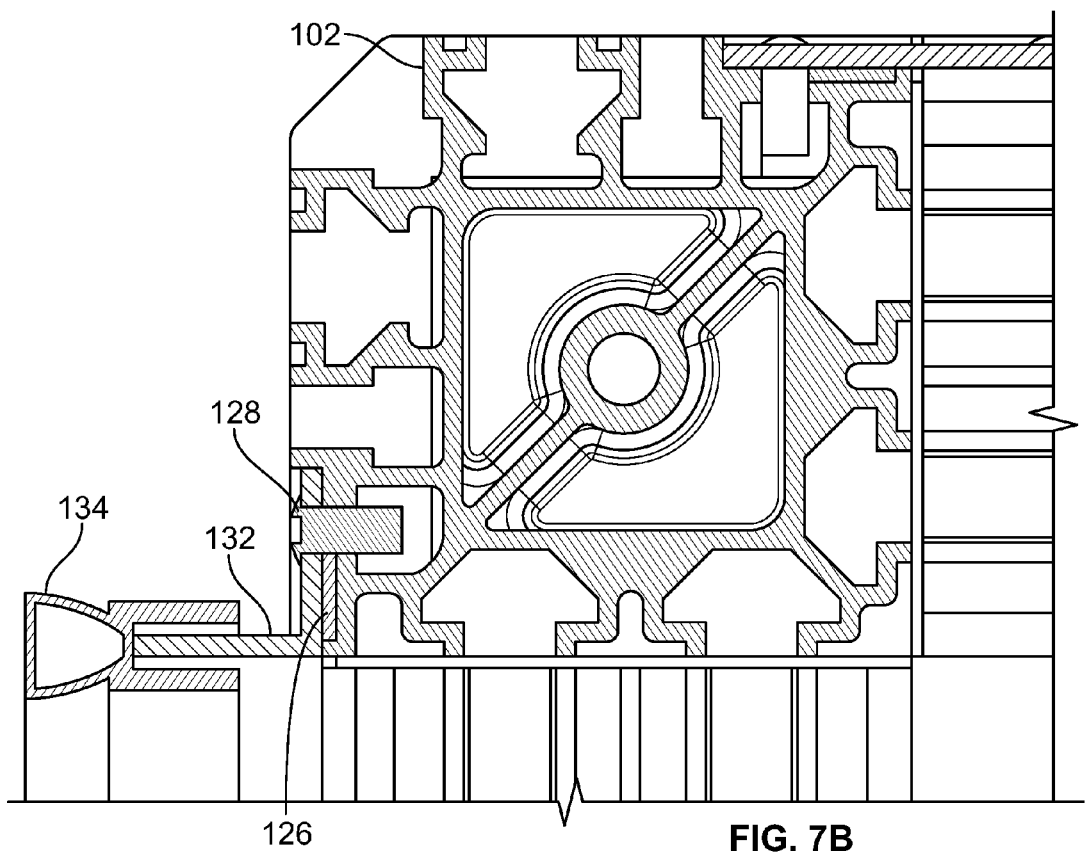
FIG. 7B is a cross-sectional view of the frame member and door gasket frame of FIG. 7A.

FIG. 7B illustrates a cross-sectional view of the frame member 102 and door gasket frame 132 of FIG. 7A. The door gasket frame 132 and gasket 126 are coupled to frame member 102 via fastener 128. Door gasket 134 is coupled to the door gasket frame 132.

Figure 8A:
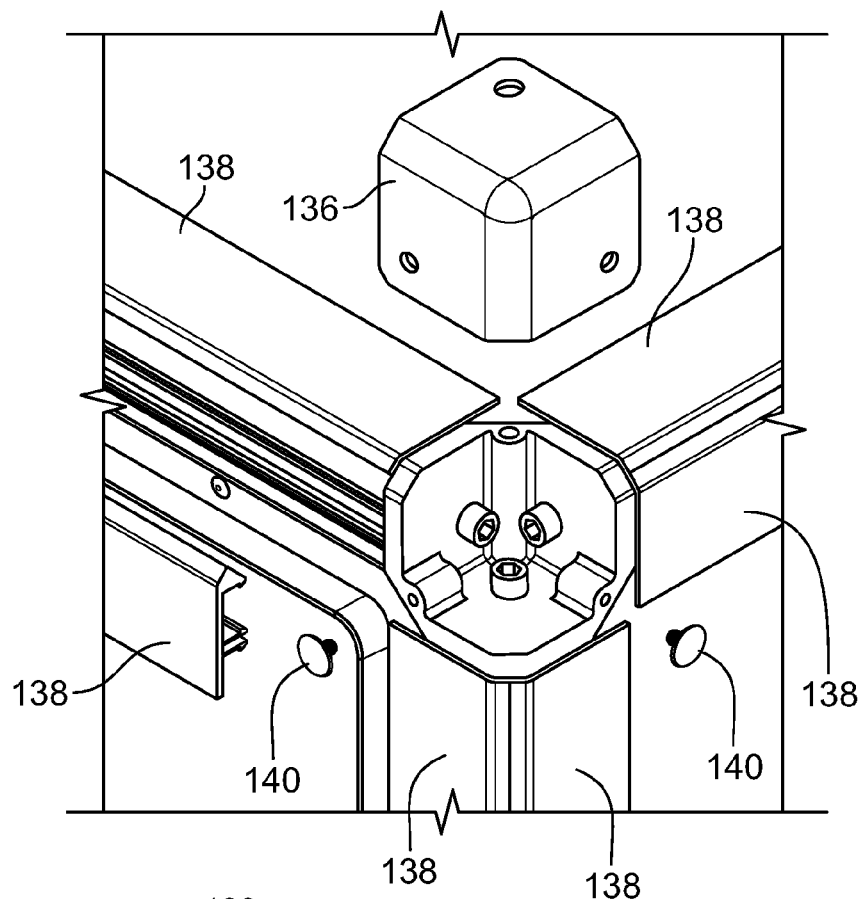
FIG. 8A is a perspective view of a portion of the cabinet frame of FIG. 7A including a copula cover and frame member covers.

FIG. 8A is a perspective view of a portion of the cabinet frame 100 of FIG. 7A including copula covers 136 and frame member covers 138. The copula covers 136 may attach to corner copulas 104 by inserting a corner copula plug 140 or the like through a hole in the copula cover 136 and into the mounting boss 122 of the corner copula (shown in FIG. 3) as explained above. The frame member covers 138 may attach to the frame members 102 by inserting a prong 139 of the frame member 138 into the pocket 114 of a frame member (shown in FIG. 2) as explained above. The frame member covers 138 may cover substantially all of an external portion (e.g., external sides 107, etc.) of a frame member 102, only a portion of a frame member 102, etc. Similarly, the corner copula covers 136 may cover substantially all of an external portion (e.g., external sides 103, etc.) of a corner copula 104, only a portion of a corner copula 104, etc.

Figure 8B:
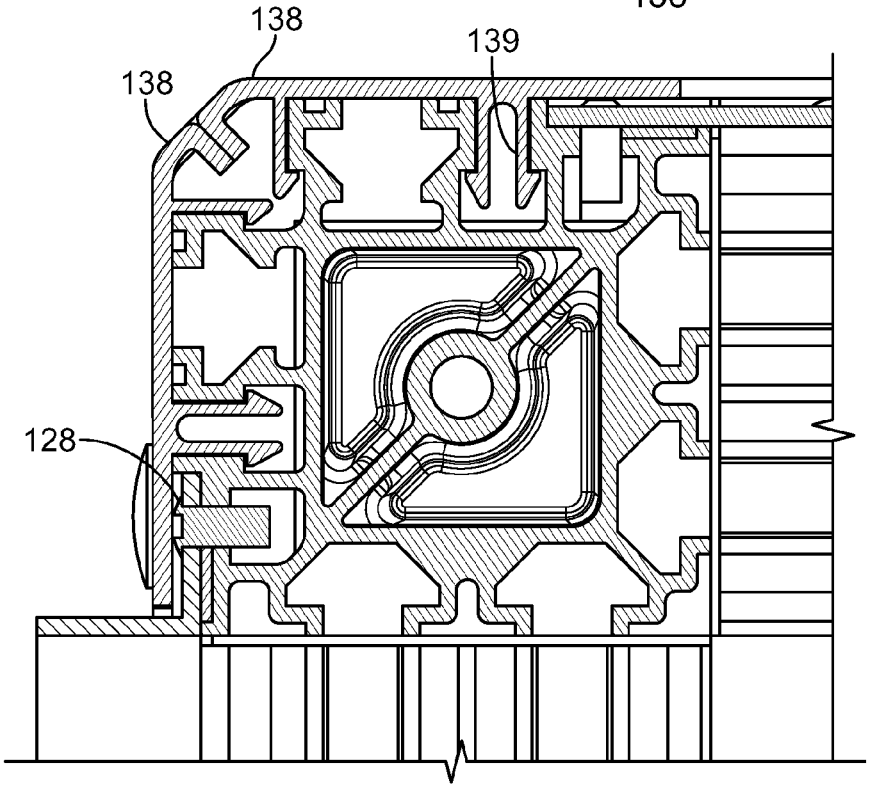
FIG. 8B is a cross-sectional view of the frame member and frame member cover of FIG. 8A.

FIG. 8B also illustrates a cross section of a frame member 102 having two frame member covers 138, and a rivet 128 (as explained above). As shown, the frame member cover 138 may be snapped into the pocket 114 after the rivet 128 is inserted into the slot 112, thereby allowing frame member covers 138 to be attached to frame members 102 after external components (e.g., panels, door gasket frames, etc.) have been mounted to the cabinet frame 100.

Figure 9A:
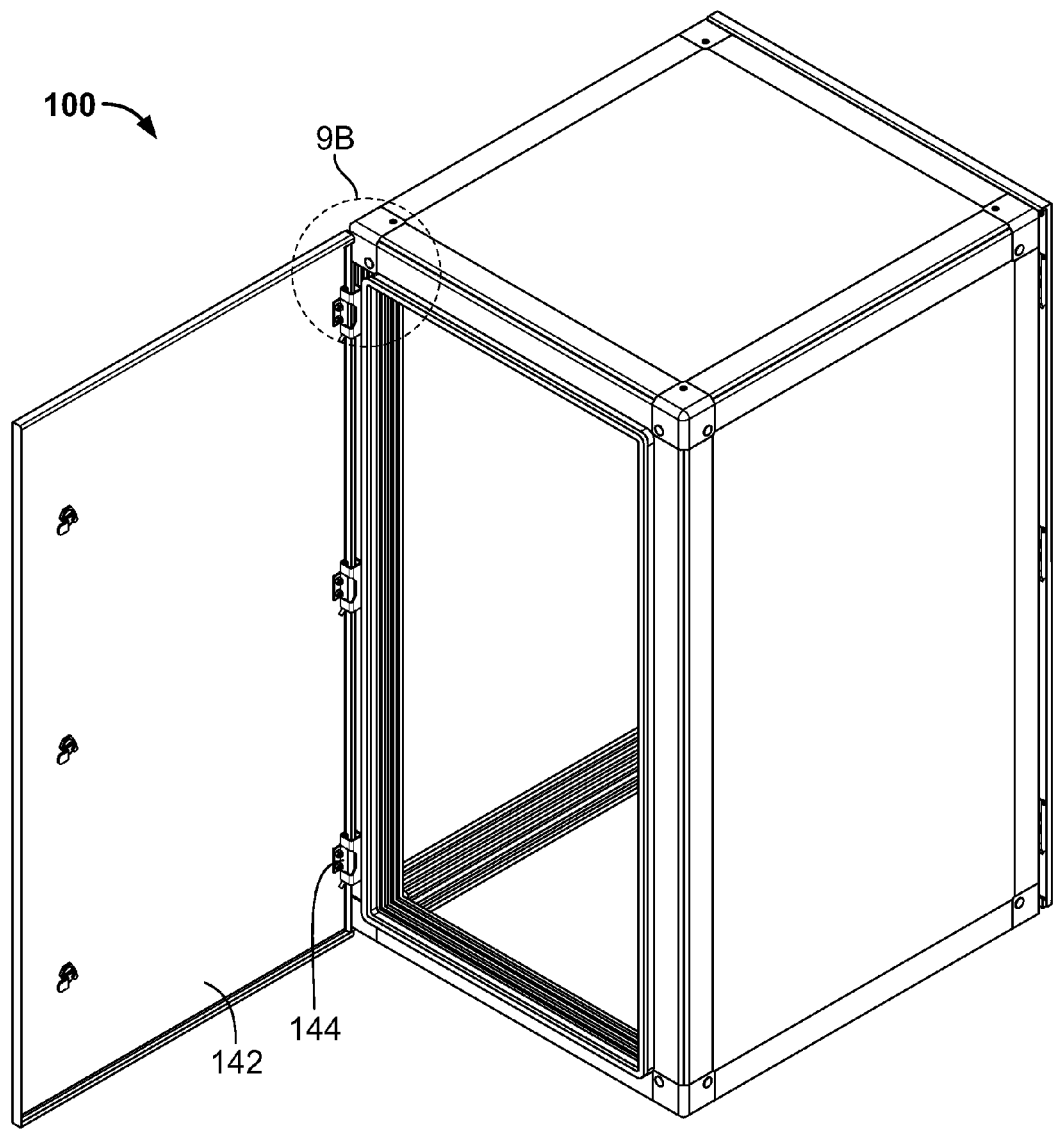
FIGS. 9A and 9B are perspective views of the cabinet frame of FIG. 8A including a door and a door hinge.
Figure 9B:
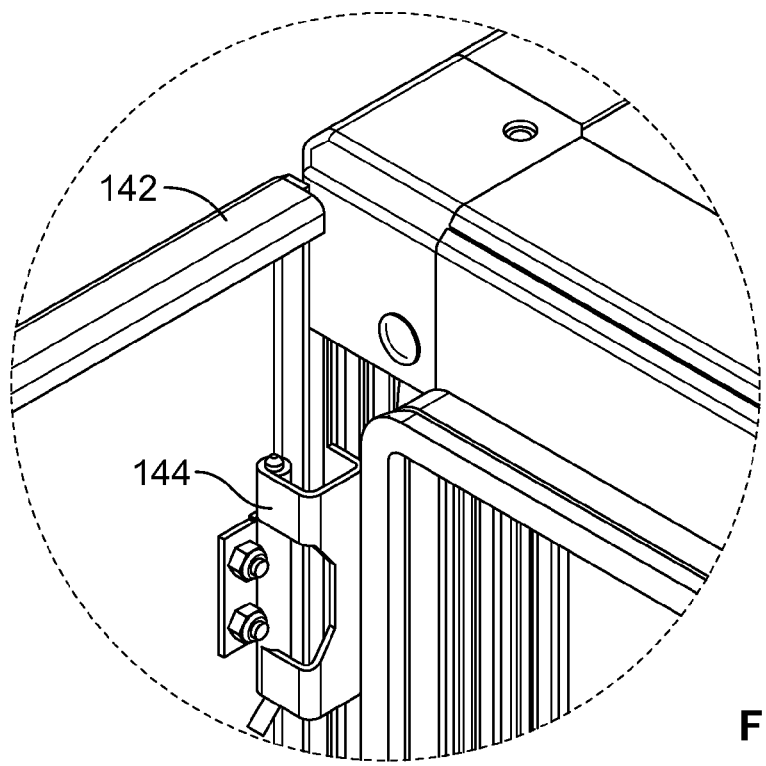
Figure 9C:
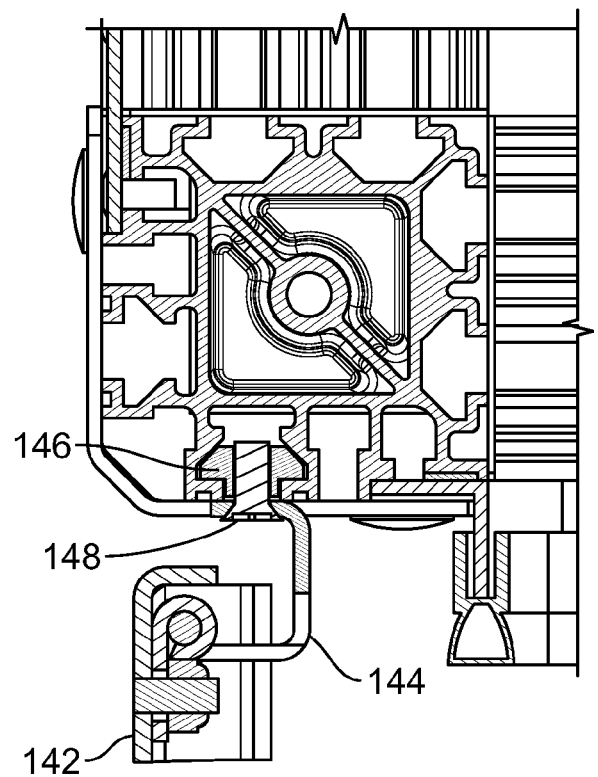
FIG. 9C is a cross-sectional view of the frame member, door and door hinge of FIGS. 9A and 9B.

FIGS. 9A and 9B are perspective views of the cabinet frame 100 of FIG. 8A including a door 142 and a door hinge 144. The door hinge 144 may be coupled to one of the frame members 102 by inserting a door hinge screw 148 or the like through the door hinge 144 and into a receiver 146 (e.g., a nut, T-nut, fastener receiver, etc.) positioned in the slot 110 of the frame member 102 (shown in FIG. 2) as explained above. The slot 110 may allow for sliding a receiver up and down the slot 110 to find a desired location for coupling the door hinge to the frame member 102. The door 142 may be coupled to any side of the cabinet frame 100. Some embodiments may include more doors 142, no doors, etc. FIG. 9C is a cross-sectional view of the frame member 102, door hinge 144 and door 142 of FIGS. 9A and 9B.

Figure 10:
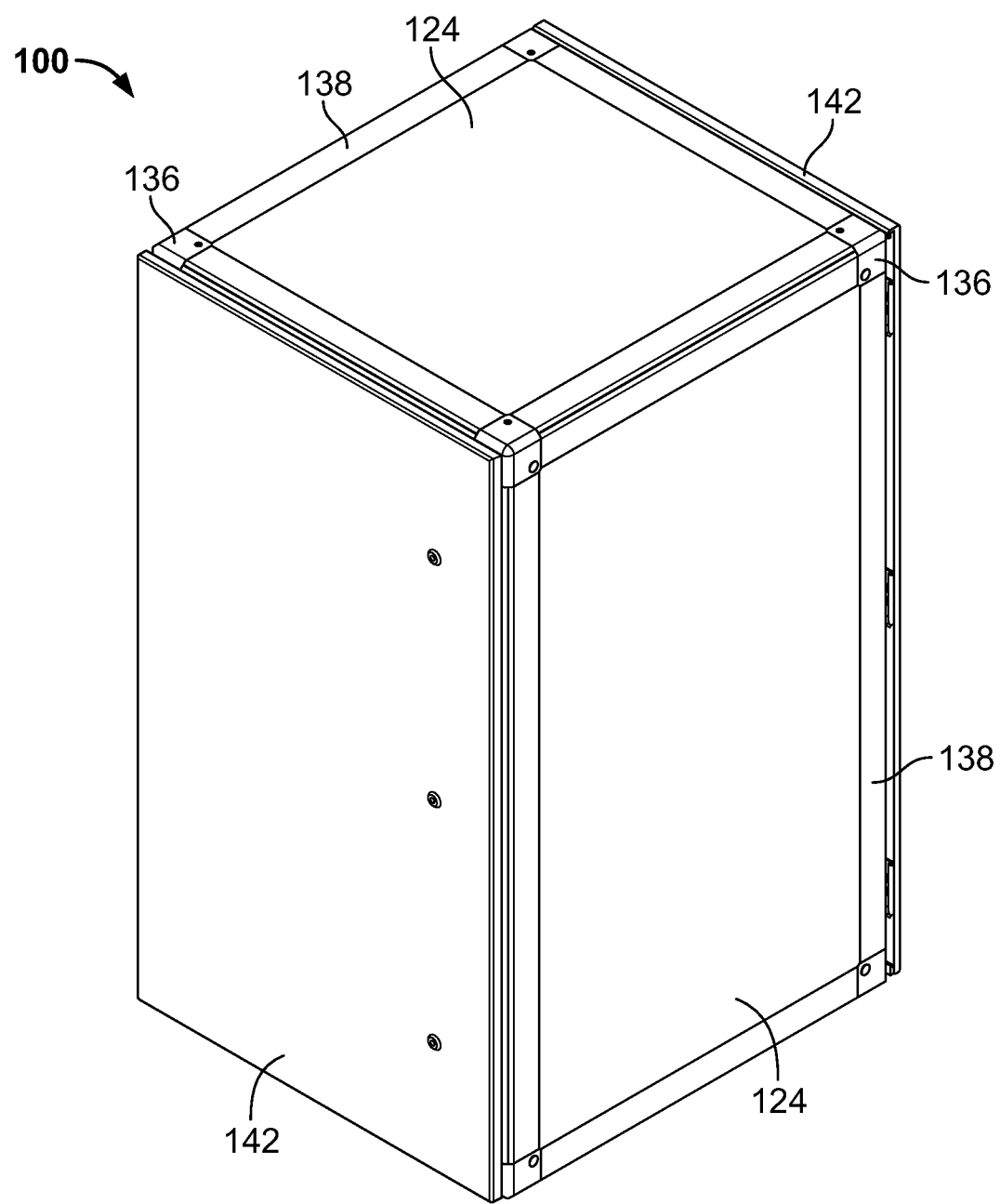
FIG. 10 is a perspective view of the cabinet frame of FIG. 9A, with front and back doors in a closed position.

FIG. 10 illustrates the cabinet frame 100 of FIG. 9A, with front and back doors 142 in a closed position. FIG. 10 also illustrates panels 124 on a top and side of the cabinet frame 100, copula covers 136 covering corner copulas 104, and frame member covers 138 covering frame members 102 as explained above. For example, the electrical equipment cabinet illustrated in FIG. 9 may inhibit water, dirt, debris, other contaminants, etc. from entering the electrical equipment cabinet to protect any components (e.g., electrical components, etc.) disposed within the cabinet.

Any one or more of the example external components (e.g., panels, doors, door hinges, gaskets, door gasket frames, copula covers, frame member covers, etc.) may be mounted, coupled, attached, etc. to the cabinet frame 100 in any suitable fashion, and the example external components may be used in any suitable combination. For example, some embodiments may include all of the external components, some embodiments may not include some of the external components, some embodiments may include other external components, some embodiments may include more or less (or none) of different types of external components described above, etc. Additionally, any one or more channels, surfaces, etc. of the frame members and/or corner copulas may be modified as desired to receive, support, align, etc. any one or more of the external components.

Additionally, some of the example aspects described herein may allow for a cabinet frame to have frame members with a single cross-sectional profile (e.g., each frame member may have the same configuration of channels, surfaces, etc. when viewed from an end of the frame members) and copula geometry (e.g., each corner copula may have the same shape), which may provide modular assembly of different size cabinet designs (e.g., different heights, widths, depths etc. based on different lengths of frame members). Additionally, some of the example aspects may provide external mounting of cabinet panels and doors with gaskets, may not require secondary operations (e.g., drilling holes in the frame members, which may damage parts and lead to scrapping and waste of parts) for external component assembly, may provide for concealing covers to be attached to the cabinet frame (which may reduce the need to paint frame members and may provide a desired cosmetic appearance), etc.

According to aspect of the present disclosure, an electrical equipment cabinet may be assembled (e.g., constructed, manufactured, etc.), by coupling a plurality of members together by coupling corner copulas between adjacent frame members. The frame members may be coupled to define sides (e.g., four sides, etc.), a top, and a bottom of the cabinet. One or more external components may be coupled to the external portions of the frame members.

The frame members 102 may be any suitable material(s), including aluminum, etc. Similarly, the corner copulas 104 may be any suitable material(s), including aluminum, etc. The corner copulas 104 may be the same material as the frame members 102, may be different material than the frame members 102, may have the same material and other different material, etc.

For example, a strip gasket may be coupled to a strip gasket surface of adjacent frame members and aligned with a stop surface of each adjacent frame member. A panel, door frame, etc. may be coupled to a frame member by inserting one or more rivets through the panel, door frame, etc. and into a rivet slot of each adjacent frame member. A continuous bulb gasket may be coupled to a rivet slot of each frame member by inserting a portion of the bulb gasket into the rivet slot. A frame member cover may be coupled to a pocket of a frame member by inserting a snap member of the frame member cover into the pocket. Coupling the external components may only require access to an external portion (e.g., external sides 107, etc.) of a frame member, and the external components may be coupled without drilling holes in any of the frame members.

Referring again to FIG. 2 and as explained above, the frame member 102 may include internal sides 109 having multiple channels and surfaces for assembling internal cabinet components (e.g., equipment, supports, etc.). For example, each internal cabinet side 109 may include slots 111 (e.g., channels, etc.) for receiving a receiver (e.g., a nut such as a T-Nut, a fastener receiver, etc.) or the like. Once inserted into the slot 111 (e.g., via an end of the frame member 102), the slots 111 may be configured to restrict the receiver from exiting from the internal cabinet side 109. Therefore, internal components (e.g., equipment rails, internal frames, etc.) may be mounted, attached, etc. to the frame member 102 by inserting fasteners (e.g., hardware, bolts, screws, etc.) into the receiver positioned in the slot 111.

The frame member 102 may define various surfaces (e.g., surfaces 152, etc.) adjacent the slots 111 to provide support for internal components mounted to the frame member 102 as explained above. For example, an internal component may be positioned against surface 152 (e.g., a mounting surface, etc.).

Although FIG. 2 illustrates two slots 111 (e.g., channels, etc.) and at least four surfaces 152 (e.g., mounting surfaces, etc.) on each internal cabinet side 109 of the frame member 102, other embodiments may include more or less slots and/or surfaces.

Figure 11A:
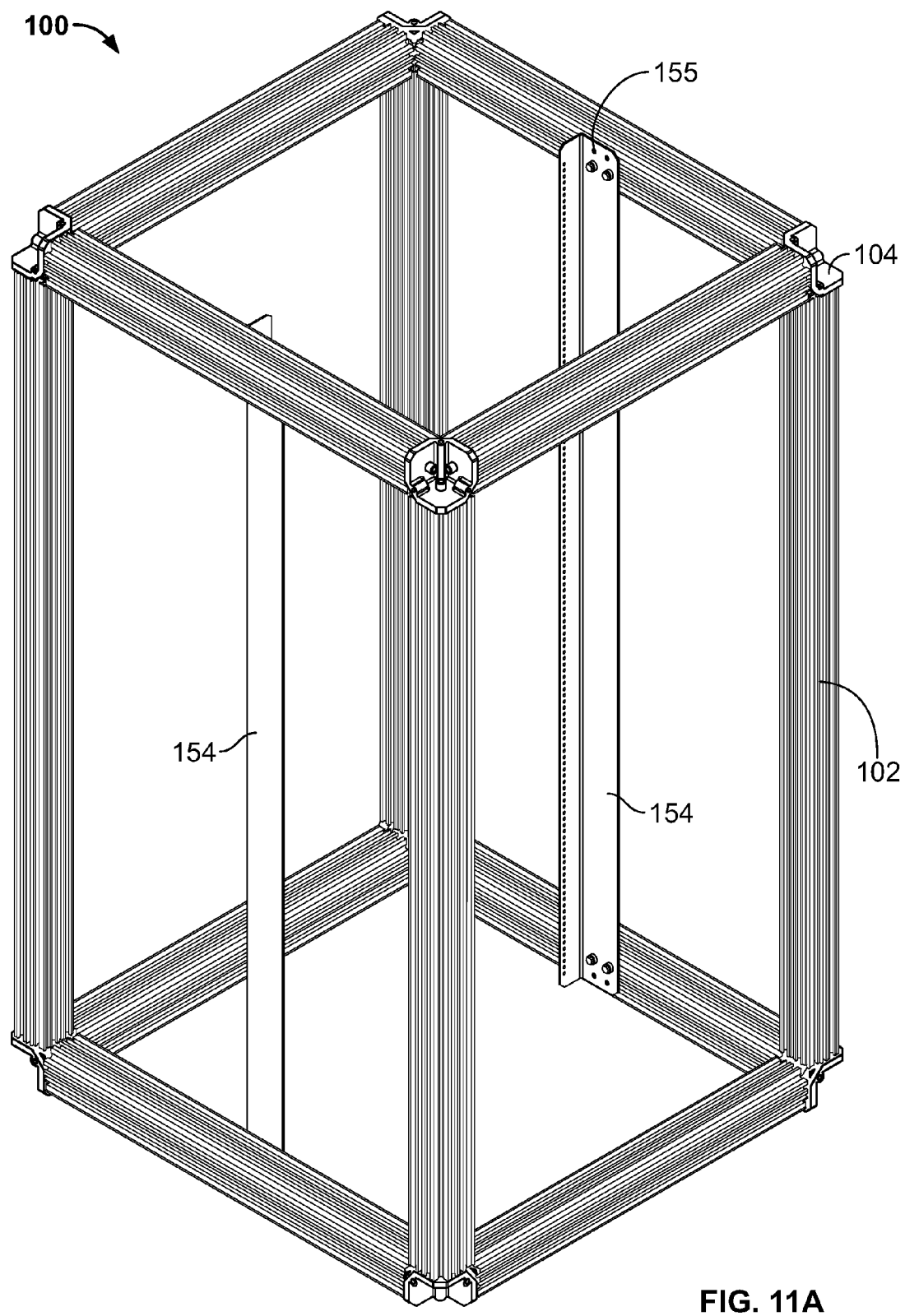
FIG. 11A is a perspective view of the cabinet frame of FIG. 1 including two internal components coupled to internal sides of frame members.
Figure 11B:
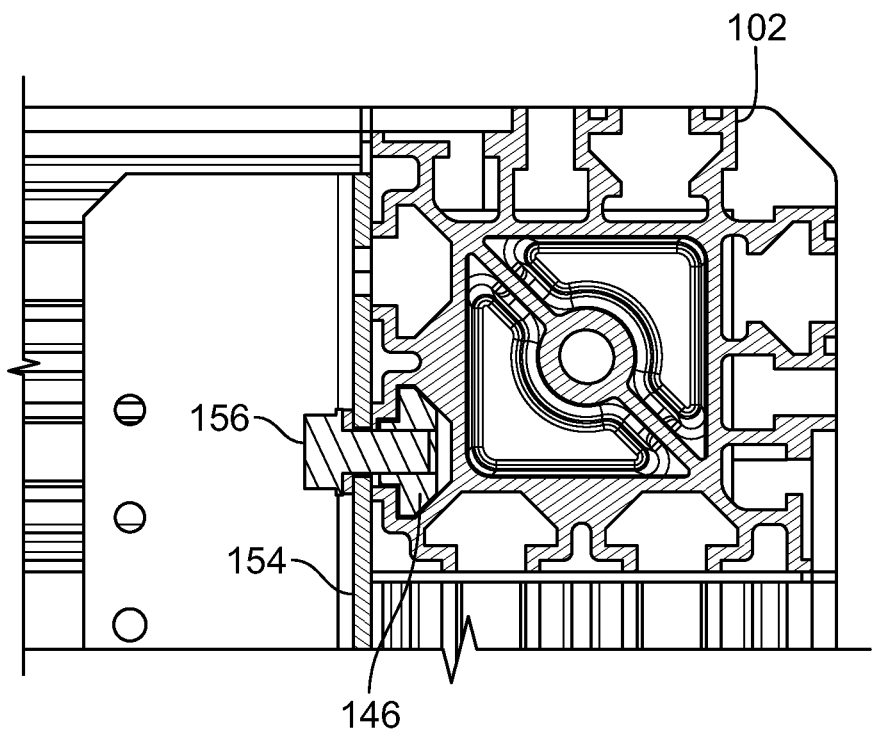
FIG. 11B is a cross-sectional view of the internal component coupled to the frame member as shown in FIG. 11A.

FIG. 11A illustrates the cabinet frame 100 of FIG. 1 including two internal components 154 (e.g., equipment rails, internal frames, etc.) coupled to internal sides 109 of frame members 102. Each internal component 154 defines multiple openings 155 (e.g., holes, etc.) for receiving fasteners 156. As shown in FIG. 11A, one internal component 154 may be coupled to the frame member 102 by inserting the fasteners 156 through openings 155 in the internal component 154 and into a receiver 146 (e.g., a T-nut, etc.) positioned in the slot 111 (shown in FIG. 2). FIG. 11B is a cross-sectional view of a frame member 102 of FIG. 11A and an internal component 154 fastened to the frame member 102 via faster 156 and fastener receiver 146.

Figure 12:
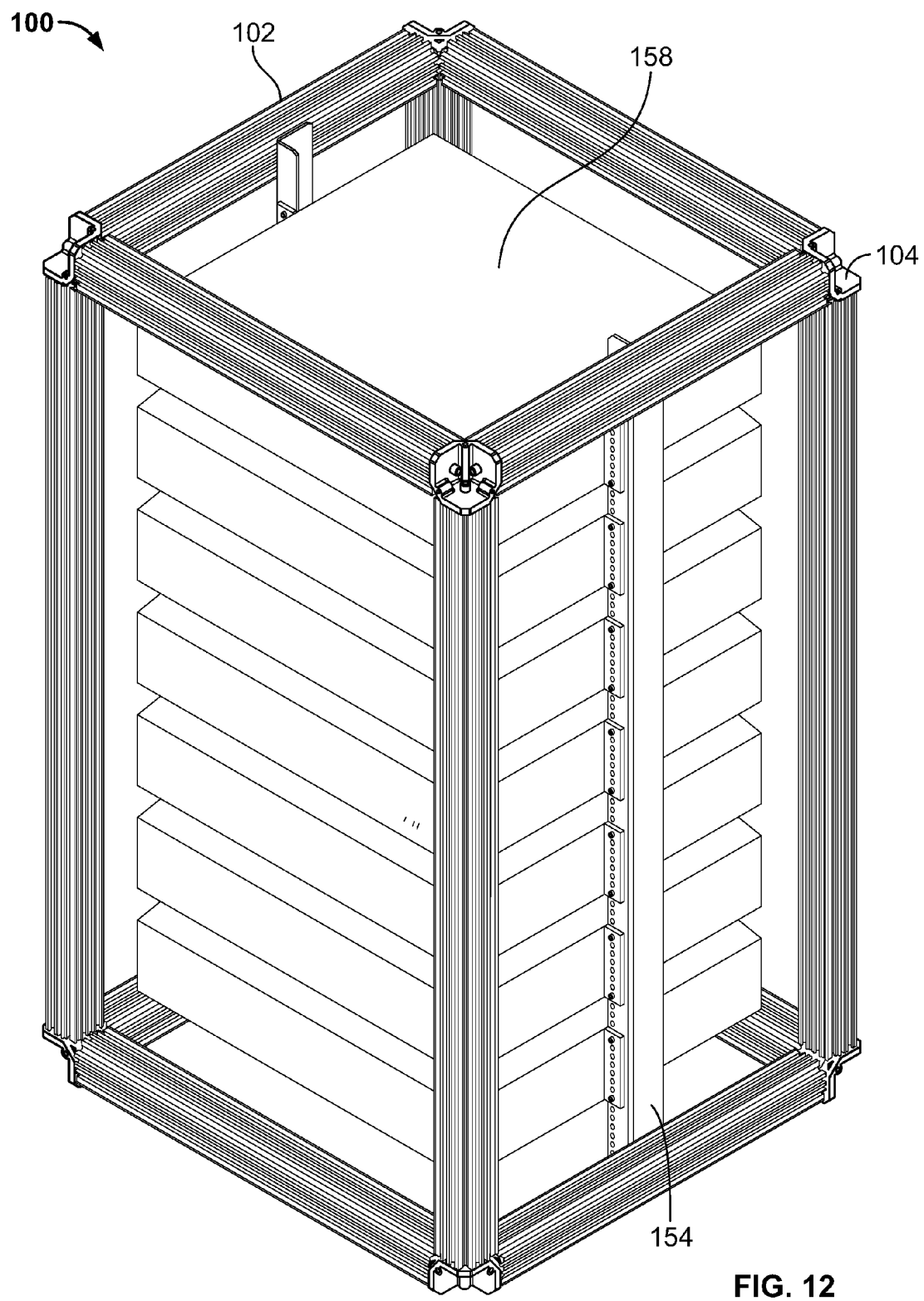
FIG. 12 is a perspective view of the cabinet frame of FIG. 11A including equipment coupled to the internal components.

FIG. 12 illustrates the cabinet frame 100 of FIG. 11 including equipment 158 coupled to the internal components 154. The equipment 158 may be any suitable cabinet equipment including, for example, transmission equipment, power equipment, electronic components, etc.

Although FIGS. 11A and 12 illustrate two internal components 154 for supporting the equipment 158, the internal components 154 defining four openings 155, etc., other embodiments may include more or less internal components, openings, etc., other configurations of internal components and/or equipment, etc. For example, an internal component 154 (e.g., equipment rail, internal frame, etc.) may be coupled horizontally between two frame members 102, diagonally, etc.

Figure 13:
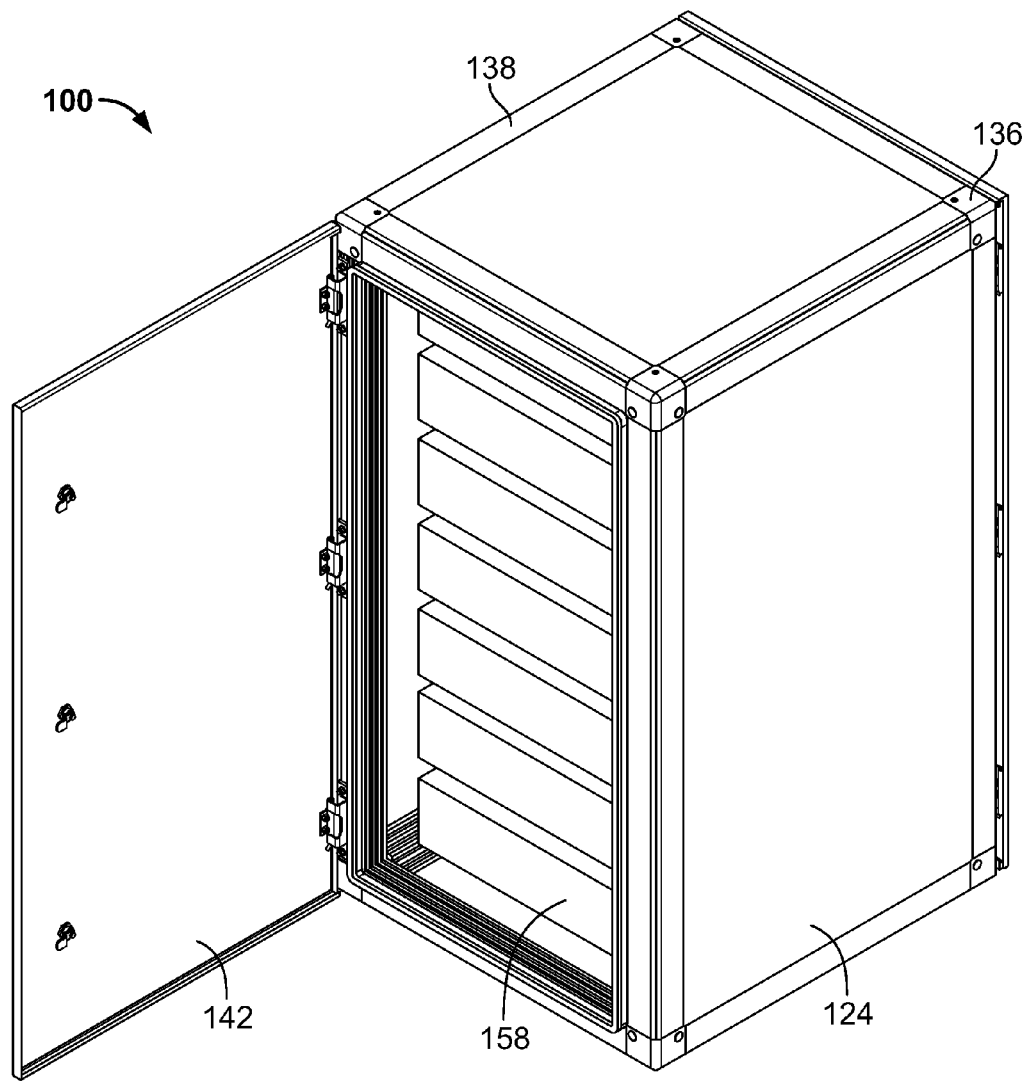
FIG. 13 is a perspective view of the cabinet frame of FIG. 12 including a door, panels, copula covers and frame member covers enclosing the internal equipment.

FIG. 13 illustrates the cabinet frame 100 of FIG. 12 including two doors 142, two panels 124, eight copula covers 136 and sixteen frame member covers 138, internal components 154 (not shown), and the equipment 158. The internal components 154, equipment 158 and/or other internal elements may be mounted to the frame members 102 prior to mounting external panels 124. Accordingly, internal elements may be coupled to the cabinet frame 100 first, and then external components can be added after without interfering with the installed internal components. This may allow for a simplified assembly in which internal components do not need to be moved to install external components.

As shown in FIG. 13, the doors 142 are positioned on opposing sides of the cabinet frame 100 while the panels 124 are positioned on the other opposing sides of the cabinet frame 100. In other embodiments, the door(s) may be located in other positions. As explained above, the copula covers 136 substantially covers the corner copulas (not shown) and the frame member covers 138 substantially covers the frame member 102.

One or more of the aspects of the internal cabinet side 109 of the frame members 102 described herein may allow users to assemble, have access to, etc. internal components in the cabinet frame 100 before installing external panels, walls, doors, etc. on the cabinet frame. As such, the internal components may be configured, installed, modified, etc. with greater ease, in less time, etc., and may be configured prior to assembly of any external panels. Additionally, the slots 111 may allow internal component assembly without time consuming and potentially damaging secondary operations (e.g., drilling holes in the frame members, bending the frame members, etc.).

Any one or more of the internal component features (e.g., internal components, equipment rails, etc.) may be used in any suitable combination with any one or more of the above described external component features. Accordingly, a frame member may include any suitable combination of internal side slots, internal side surfaces, external side slots, external side surfaces, etc.

According to another aspect of the present disclosure, an electrical equipment cabinet may be constructed by coupling a plurality of frame member together using corner copulas between adjacent frame members. At least two of the frame members may include an internal side 109 having a channel and a corresponding mounting surface. One or more internal components may be coupled between channels of at least two frame members. The frame members may be opposite frame members (e.g., positioned on opposite sides of the cabinet frame 100, etc.).

Coupling an internal component may include positioning a fastener receiver (e.g., a T-nut, etc.) in a channel of a frame member, and inserting a fastener through an opening of the internal component and into the fastener receiver. One or more electrical equipment components may be coupled to the internal component.

As shown in FIGS. 2, 3, etc., each frame member 102 may define an opening (e.g., sometimes referred to as a profile opening) at an end of the frame member 102. This opening may extend the entire length of the frame member 102 (e.g., one channel extending from one end of the frame member to the other end). Alternatively, the opening may extend a distance less than the length of the frame member 102 (e.g., each end of the frame member 102 may include its own respective opening).

In the example of FIG. 3, the openings are rectangular. It should be apparent, however, other embodiments may include other suitable shaped openings (e.g., square, triangular, circular, etc.).

As shown in FIG. 2, the frame member 102 may include a connecting rib or the like traversing from opposing edges of the frame member. For example, and as shown in FIG. 2, the connecting rib may extend from one corner of the frame member to another opposing corner at a 45 degree angle. Alternatively, the connecting rib may extend parallel with respect to one of the sides of the frame member 102. In other embodiments, the frame member 102 may include more than one connecting rib (e.g., a crossing, intersecting, etc. pattern), the connecting rib may extend between central portions of two opposite interior walls of the frame member, etc.

The connecting rib shown in FIG. 2 includes a boss (e.g., sometimes referred to as a central boss structure) positioned adjacent a midpoint of the frame member opening (e.g., at or near a midpoint of the connecting rib). The boss defines an opening for receiving a fastener or the like (as further explained below) to couple the corner copula 104 to the frame member 102.

FIGS. 14-18 illustrate an example corner copula 204 for coupling to three frame members 202, according to another example embodiment of the present disclosure. If desired, the corner copula 204 may be employed to couple frame members 102 of FIG. 1.

Figure 14:
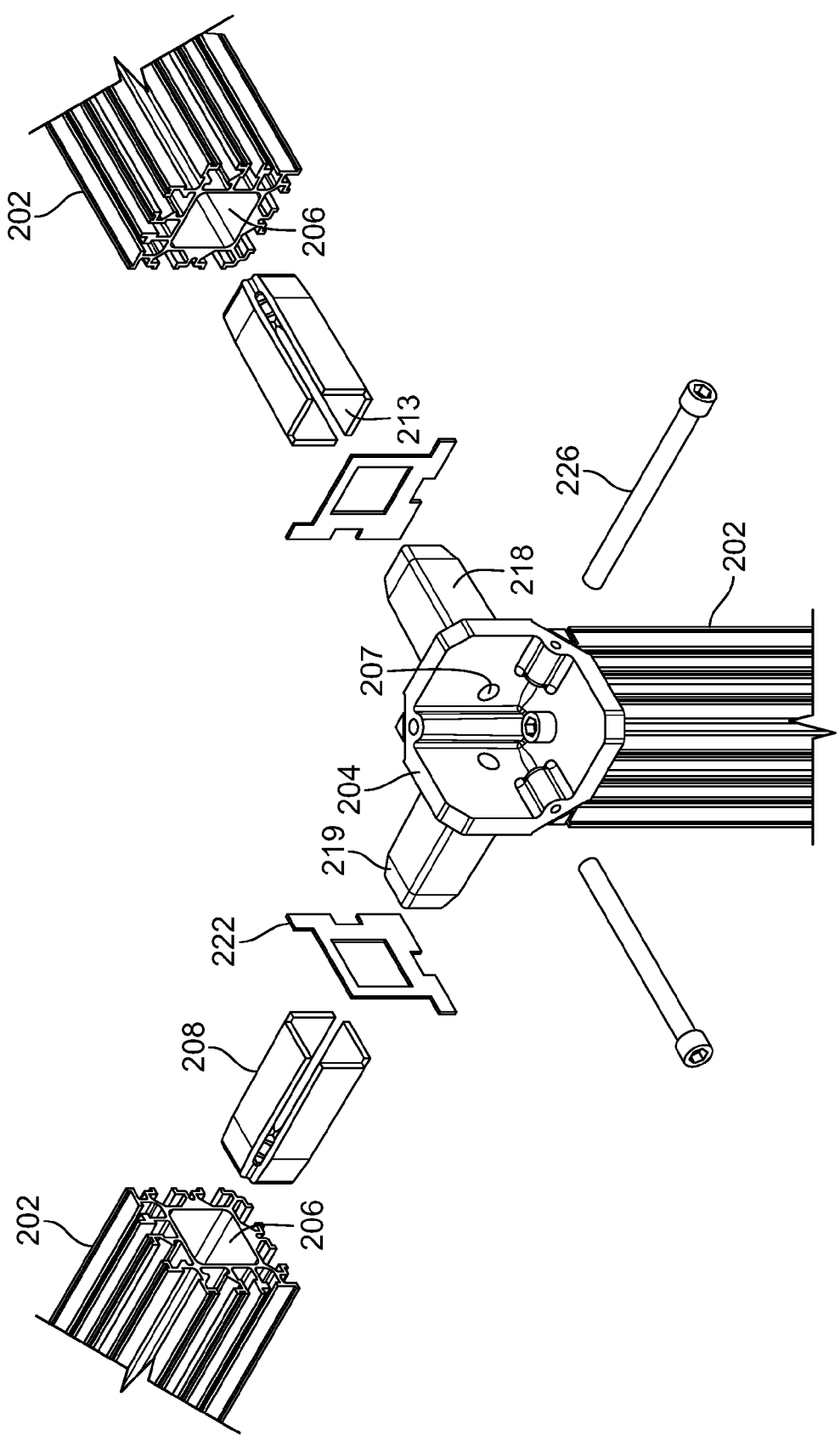
FIG. 14 is an exploded view of a corner copula and three frame members according to another example embodiment of the present disclosure.

As shown in FIG. 14, the end of each frame member 202 defines an opening 206 (e.g., a profile opening) for receiving a portion of the corner copula 204 as further explained below. Although the openings 206 are shown as rectangular in FIG. 14, any other suitable shape may be used in other embodiments (e.g., circular, triangular, hexagonal, etc.).

In the example of FIG. 14, the corner copula 204 couples to each frame member 202 via a wedge 208. The wedge 208 may be formed of suitable material including, for example, aluminum, plastic, etc.

As shown in FIGS. 14 and 15A-C, each wedge 208 may include a back wall 210 and four arms 212 extending from the back wall 210 with a perimeter of the arms 212 defining a generally rectangular shape. The back wall 210 may be inserted into the opening 206 of one frame member 202 and may create a friction fit between the frame member 202 and the wedge 208. The arms 212 may be positioned over a portion of the corner copula 204 as further explained below. Other embodiments may include more or less (or none) arms (e.g., two arms, etc.), arms defining different perimeter shapes (e.g., rectangular, circular, triangular, etc.).

In the example of FIG. 15A, the back wall 210 defines an integrated female fastener 214 (e.g., threads, etc.) positioned at or about the midpoint of the back wall. The female fastener 214 receives a male fastener (e.g., a machine bolt, etc.) to couple the corner copula 204 to the wedge 208. Other embodiments may include other suitable coupling mechanisms.

The integrated female fasteners 214 of FIG. 15A are clinch nuts. However, it should be apparent that other suitable fasteners (e.g., clip-on cage nuts, female threads manufactured directly into the back wall, etc.) may be employed without departing from the scope of the present disclosure.

As shown best in FIG. 15C, the four arms 212 are separated from each other and include a tapering portion (e.g., from back wall 210 of the wedge 208 to an opening of the wedge, etc.). In some circumstances, these features may give the arms 212 flexibility, may enhance a friction fit between the frame member 202, the wedge 208 and a prong 219 of the corner copula 204, etc. The amount of friction between the frame member 202, the wedge 208 and a prong 219 of the corner copula 204 may be based on a length and width of the arms 212, which may be dimensioned for a desired amount of friction for a particular application.

Additionally, and as shown in FIG. 15C, the back wall 210 may define a beveled end 209 to facilitate insertion of the wedge 208 into the opening 206 of the frame member 202 as explained above. Alternatively, the back wall 210 may be substantially flat, a different shape, etc.

In the example of FIGS. 14 and 15A-C, the four arms 212 may define an outer dimension (i.e., outer perimeter) of the wedge 208. In some embodiments, this outer dimension may be slightly larger than the opening 206 of the frame member 202 (e.g., an inner parameter of the opening 206) so a compression, friction, etc. fit between the outer surfaces of the flexible arms and the interior surfaces of the opening can be achieved. This may ensure the wedge 208 remains within the frame member 202 unless an external force is applied to remove the wedge 208.

As shown in FIGS. 14 and 16A-C, each corner copula 204 includes three orthogonal walls 216 (e.g., sometimes referred to as profile mating walls) and three prongs 218. Each prong 218 extends (e.g., in a normal direction) from a corresponding wall 216. Each wall 216 includes a surface facing and eventually contacting (as further explained below) one end of the frame member 202. Each prong 218 defines a central channel 207 for receiving a fastener 226 (e.g., machine bolt, screw, rivet, etc.) to couple the corner copula 204 to the wedge 208 (e.g., via the female fastener 214) as explained above.

The prongs 218 of the corner copula 204 may be sized to correspond to internal surfaces of the wedge arms 212. In particular, surfaces of each prong 218 may be sized to ensure a compression, friction, etc. fit between the prong 218 and the internal surfaces 213 of the wedge arms 212 is achieved as the prong is inserted into the wedge. For example, each prong 218 may include a beveled end 219 and/or a tapered surface 221 to facilitate insertion into the wedge 208.

The separation of wedge arms 212 may enhance the friction fit between frame member 202, the wedge 208 and the prong 218 of the corner copula 204. The separation allows the wedge arms 212 to move away from each other as the prong 218 is drawn into the wedge 208 by the fastener 226. As the wedge arms 212 move away from each other, they provide increased contact, pressure, friction, etc. between the prong 218 and the interior walls. In some embodiments, the fastener 226 may draw the frame member 202 to a fixed depth (e.g., directly against the wall 216 of the corner copula 204, etc.).

Figure 16B:
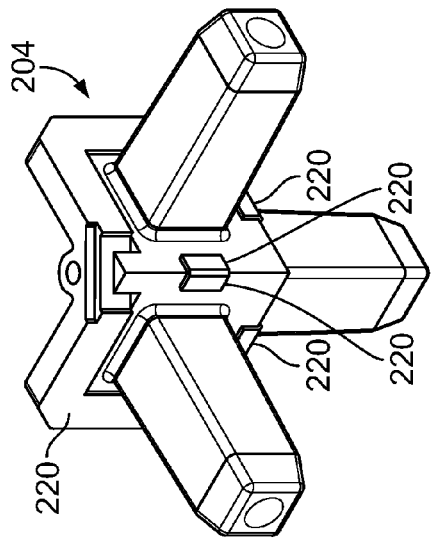
FIGS. 16B and 16C are perspective views of the corner copula of FIG. 14, showing raised pads and a sealing gasket surface.
Figure 16C:
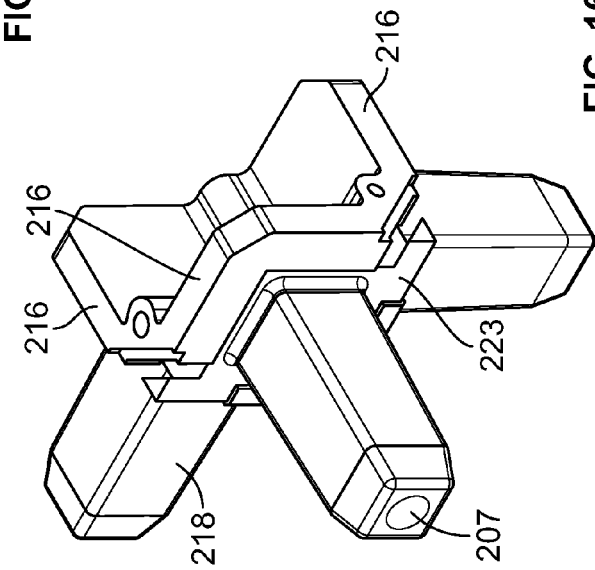
Figure 16A:
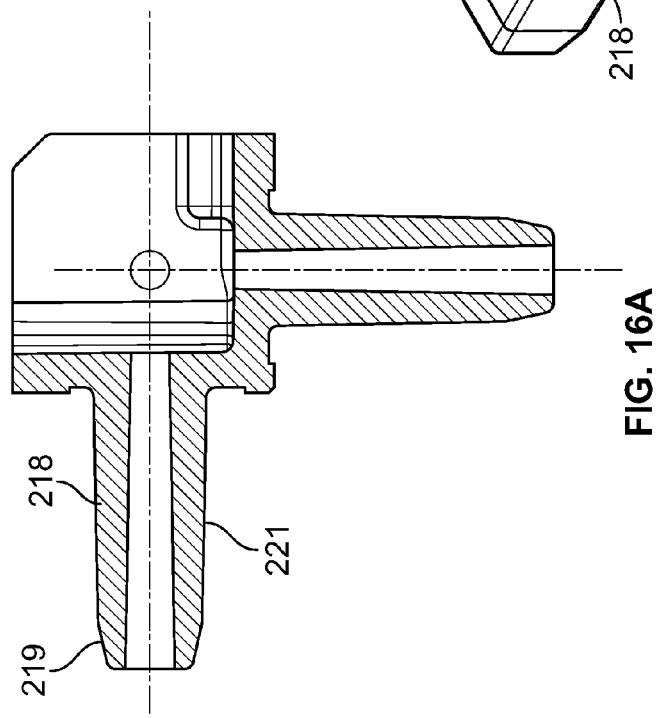
FIG. 16A is cross-sectional view of a corner copula of FIG. 14.

As shown in FIG. 16B, each corner copula 204 includes raised portions 220 (sometimes referred to as pads, etc.) extending form the walls 216. These raised portions 220 may define a recessed area 223 between the raised portions 220 and the prong 218 for receiving a gasket or the like.

Figure 17:
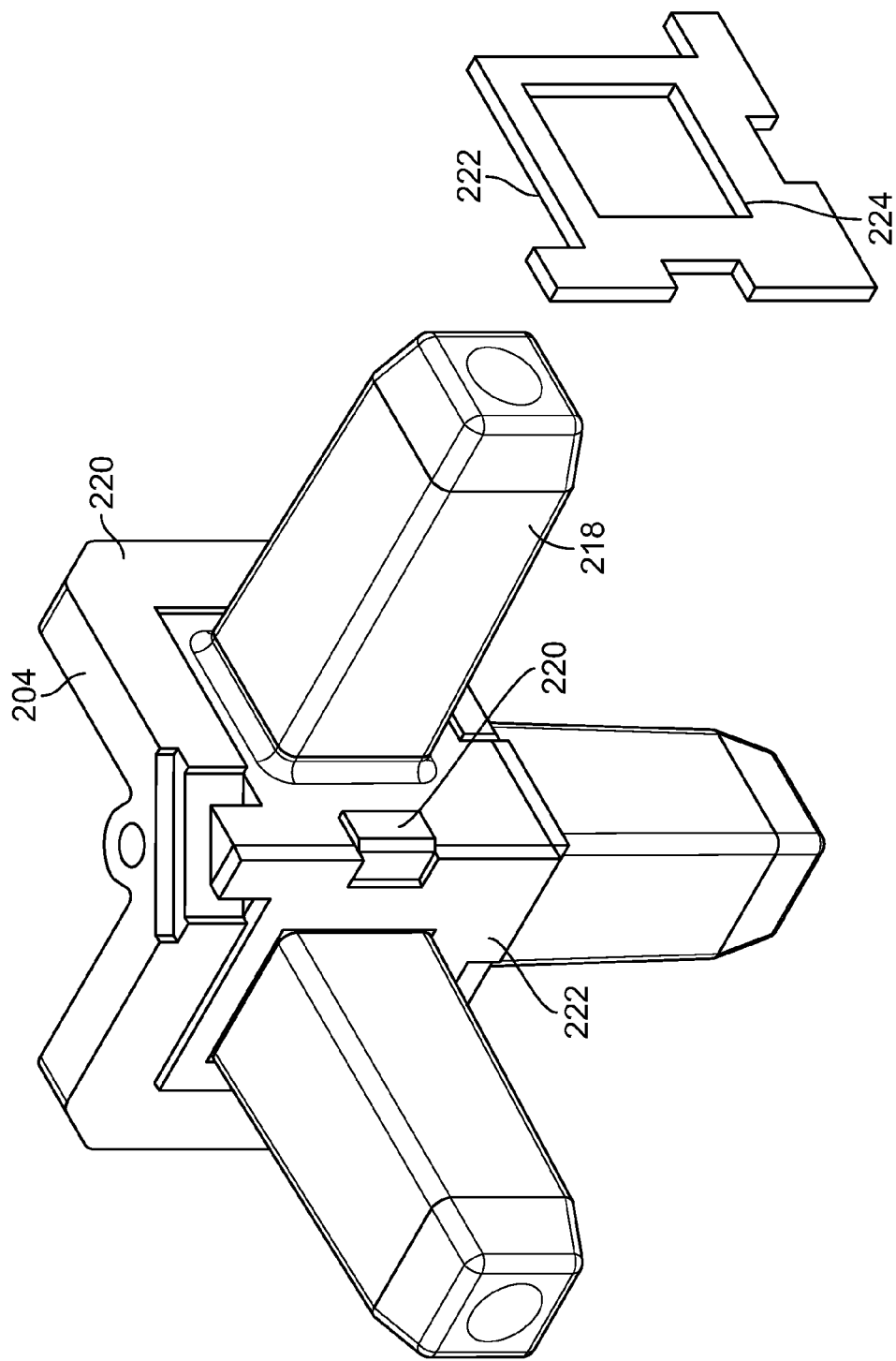
FIG. 17 illustrates a perspective view of the corner copula of FIG. 14 including a gasket.

For example, and as shown in FIG. 17, a gasket 222 (e.g., sealing gasket, etc.) may be placed in the recessed area 223 (sometimes referred to as a sealing gasket surface). The gasket 222 may be a single piece of material defining an opening 224 to fit over and about the prong 218.

The gasket 222 may be shaped to fit between the prong 218 and the raised pads 220. For example, the gasket 222 may define one or more notches, recesses, etc. adjacent an exterior perimeter of the gasket 222 to accommodate various shapes, configurations, etc. of the prong 218, the wall(s) 216 of the corner copula 204, etc. Thus, the gasket 222 may be positioned around the prong 218 so the gasket 222 is between the wall 216 of the corner copula 204 and the frame member 202.

In some embodiments, the gasket thickness may exceed the height of the raised pads 220 such that proper gasket compression at final assembly is achieved. This may assist in inhibiting water from entering between the frame members 202 and the corner copula 204. The raised pads 220 may act as a positive stop for the end of each frame member 202 so proper compression of the gasket is achieved when the corner copula 204 and frame member 202 are coupled together.

Figure 18:
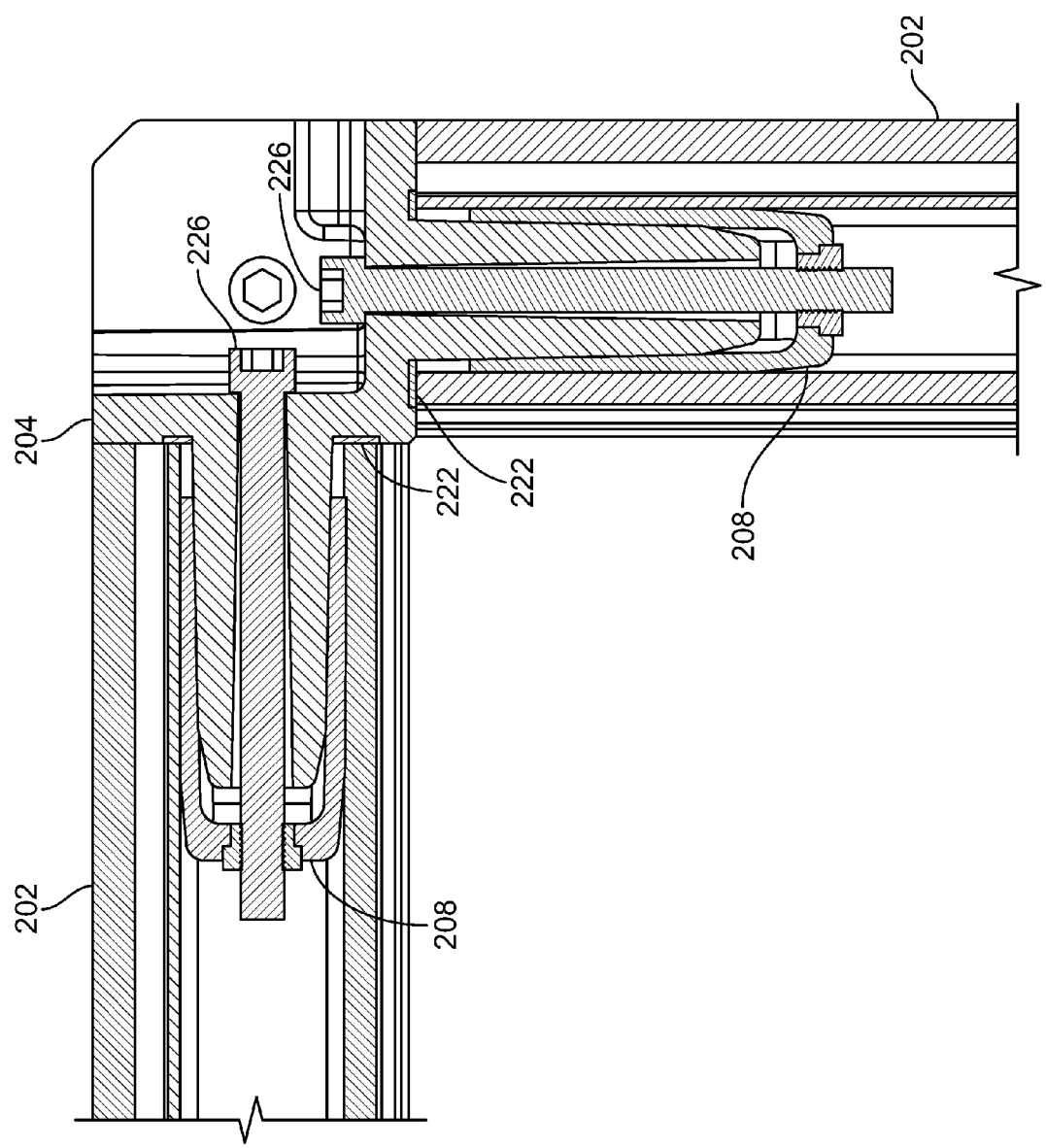
FIG. 18 is a cross-sectional view of the corner copula of FIG. 14 coupled to two frame members via wedges.

FIG. 18 is a cross sectional view of the corner copula 204 of FIG. 14 coupled to two frame members 202 via wedges 208. Fasteners 226 draw the frame members 202 and the wedges 208 against gaskets 222.

The corner copula 204 may be coupled to a frame member 202 by various methods. For example, one method may include placing the gasket 222 against one of the orthogonal walls 216 of the corner copula 204, inserting the wedge 208 into the opening 206 of the frame member 202, inserting the prong 218 of the corner copula 204 into the wedge 208, and inserting the fastener 226 through the central channel 207 of the corner copula 204 and into the female fastener 214 of the wedge 208. The fastener 226 may be rotated to draw the wedge 208 and frame member 202 against the gasket 222. In other embodiments, one or more of the above described steps may be omitted when coupling the corner copula 204 to the frame member 202. Additionally, although the above steps are listed in a particular order, the steps may be performed in any suitable order. For example, the wedge 208 may be inserted into the frame member opening 206 first to create a friction fit between only the wedge and the frame member 202. The coupled wedge 208 and frame member 202 may then be pulled onto the prong 218 and corner copula 204 as a coupled unit.

As another example aspect, a sealing gasket 222 may be applied to the corner copula 204. A wedge 208 may be inserted into the frame member opening 206 to a finite depth of insertion. The finite depth of insertion may be at least the height (e.g., thickness, etc.) of the sealing gasket. The coupled frame member 202 and wedge 208 may be assembled onto a corner copula prong 218 until resistance is realized. A fastener 226 (e.g., a machine bolt, etc.) may be inserted through the central channel 207 of the corner copula 204 to engage the female fastener 214 (e.g., threads, etc.) of the wedge 208. The fastener 226 may be tightened until the frame member 202 and wedge 208 bottom out, stop against the raised pads 220 of the corner copula 204, etc. The fastener 226 may be further tightened to a recommended torque value. The fastener 226 may be sized to provide a fixed applied torque to create a desired joint strength between the frame member 202 and the corner copula 204. This may reduce assembly process issues, damage to components, etc. The fastener 226 may reduce the amount of hardware needed to couple the frame member 202 to the corner copula 204.

Example embodiments may provide one or more advantages, including coupling of frame members and corner copulas via one central machine bolt, a three way compression fit between a frame member, a wedge and a corner copula, more efficient application of sealing gaskets between frame members and corner copulas, etc. The three-way compression fit between the frame member, wedge and corner copula may resist twisting, separation, etc. when experiencing vibration, torsional loading, etc. The prong of the corner copula may provide for alignment of the sealing gasket in an efficient manner, the raised pads may provide for easy orientation of the sealing gasket by technicians, the machine bolt may provide uniform sealing gasket compression for each connection, etc.

FIGS. 19-23 illustrate an example embodiment of a cabinet frame including a corner copula 304 and three frame members 302. The end of each frame member 302 includes an opening 306, a connecting rib 308, and a boss 309 (e.g., central boss, mounting boss, etc.) that includes threads 310 (e.g., female machine threads, etc.) for receiving a fastener 322 (e.g., a machine bolt, screw, etc.). In some embodiments, the threads 310 may be integrated threads defined by the boss 309.

The connecting rib 308 extends between opposite corners (e.g., corners defined by edges of adjacent interior walls of the frame member 302, etc.) of the opening 306 of the frame member 302. In other embodiments, the connecting rib 308 may extend between opposite interior walls of the frame member 302 (e.g., between central portions of opposite interior walls, parallel to an interior wall, etc.), between adjacent interior walls, between an interior wall and a corner, etc. The connecting rib 308 divides the opening 306 into two portions, each having a generally triangular shape. In other embodiments, the connecting rib 308 may divide the opening 306 into more or less portions (e.g., four portions, etc.), different shaped portions (e.g., square, rectangular, etc.), etc. The connecting rib 308 may provide a desired torsional resistance for a joint between the frame member 302 and the corner copula 304.

Figure 19:
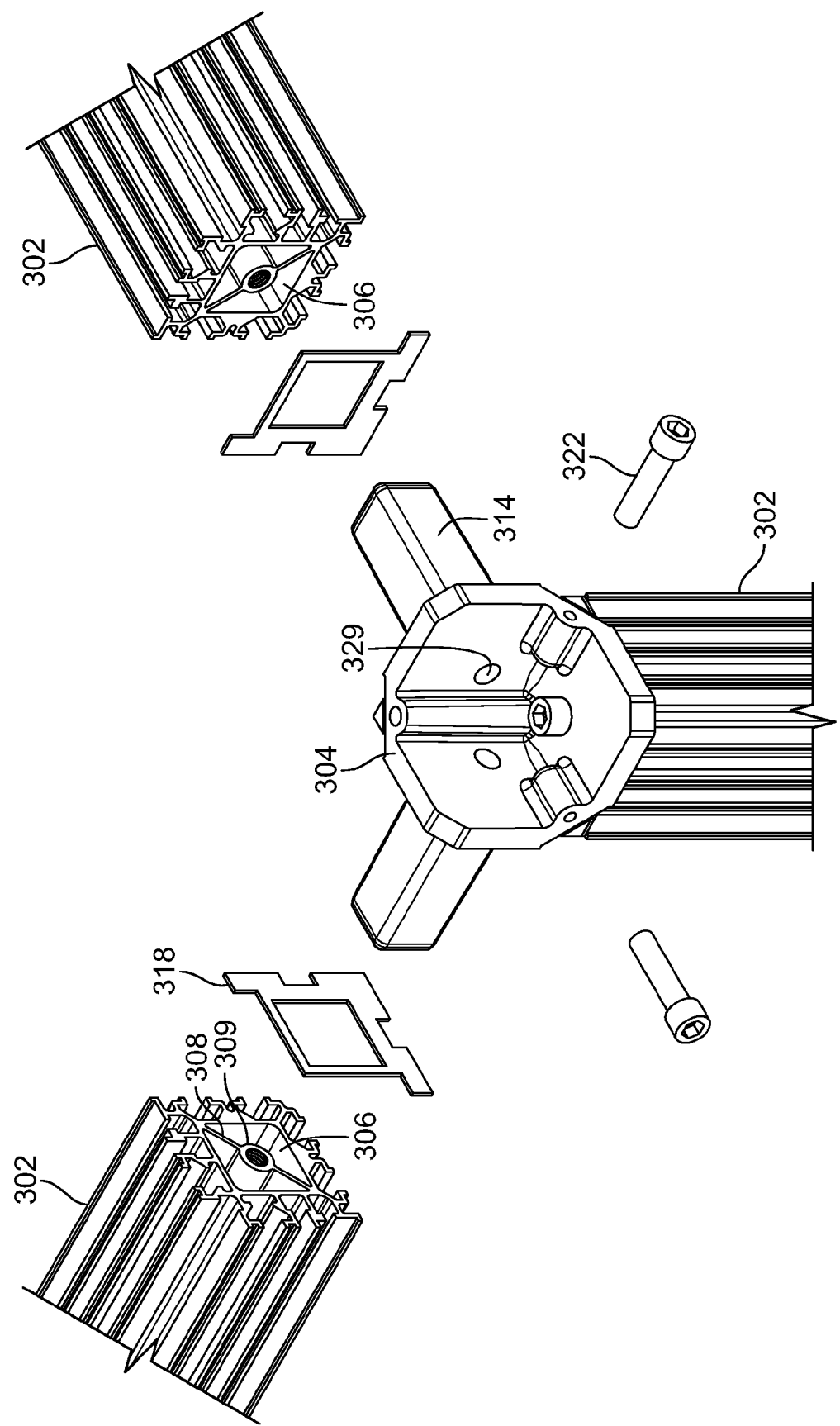
FIG. 19 is an exploded view of a corner copula and three frame members according to yet another example embodiment.
Figure 20:
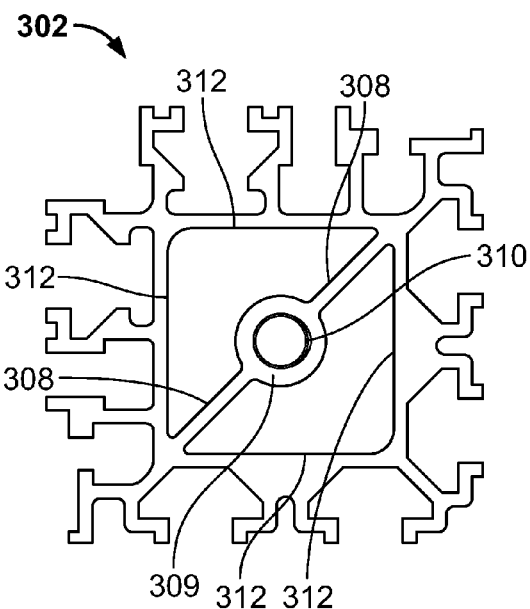
FIG. 20 is an end view of one frame member of FIG. 19 having a connecting rib and central boss structure.
Figure 21A:
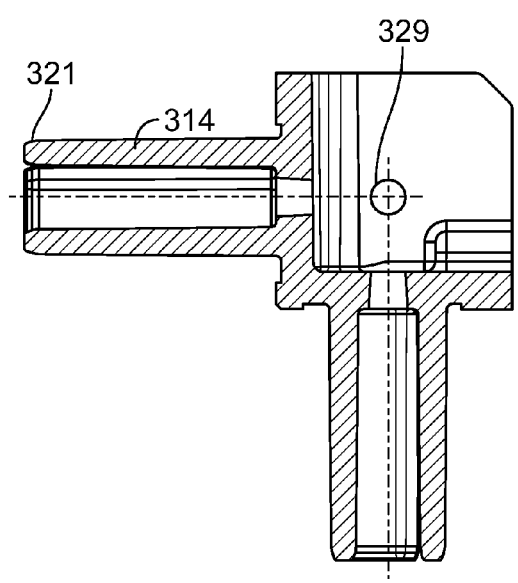
FIG. 21A is a cross-sectional view of the corner copula of FIG. 19.

As shown in FIGS. 19 and 21, the corner copula 304 includes three orthogonal walls 312 (which may be substantially similar to the walls 216 explained above with reference to FIG. 15), and a prong 314 extending (e.g., in a normal direction) from each wall 312. Each wall 312 faces (and may eventually make contact with) one end of the three frame members 302.

Each prong 314 includes two separated protruding structures 315 extending from the walls 312 to define a central channel 317. When assembled, the prongs 314 may be inserted into the openings 306 of the frame members 302. As such, the prongs 314 may be sized to correspond to the dimensions of the frame member 302 (e.g., creating a friction fit therebetween). For example, the outer walls 319 of the prong 314 may be sized to match walls of the frame member 302. Further, each prong 314 (including its separated structures) may have a beveled end 321 to facilitate insertion into the opening 306.

The inner walls 323 of the prong 314 may be sized to fit around the connecting rib 308 and the boss 309 of the frame member 302 (e.g., the prong 314 and central channel 317 may have a cross-section corresponding to a cross-section of the connecting rib 308 and boss 309, etc.). For example, the prong 314 includes two separate structures 315 extending from its respective orthogonal wall 312. The structures 315 may be substantially triangular shaped (e.g., have an approximately L-shaped cross section, have at least two exterior surfaces that are substantially perpendicular, etc.) with a recessed area 325 along a base. The recessed areas 325 define a central channel 317 for receiving the fastener 322 (explained above). The connecting rib 308 slides through the space between the separated structures 315 (i.e., the central channel 317) and the boss 309 slides through the recessed areas 325 when the prong 314 is inserted into the opening 306. For example, the structures 315 may be inserted into respective portions of the opening 306. The structures 315 may create a friction fit between the frame member 302 and structures 315 to couple the frame member and the corner copula 304.

Figure 21B:
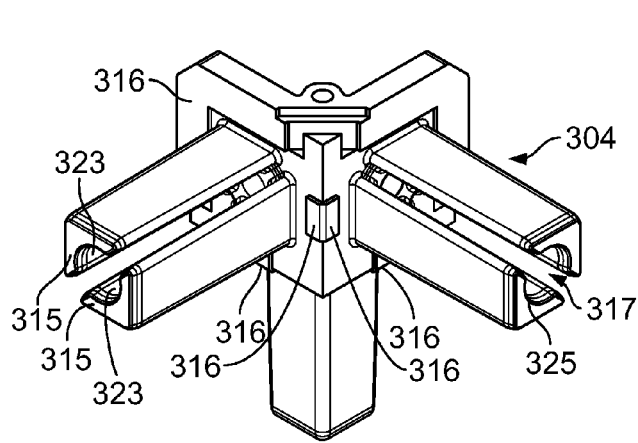
FIGS. 21B and 21C are perspective views of the corner copula of FIG. 19, showing raised pads and a sealing gasket surface.
Figure 21C:
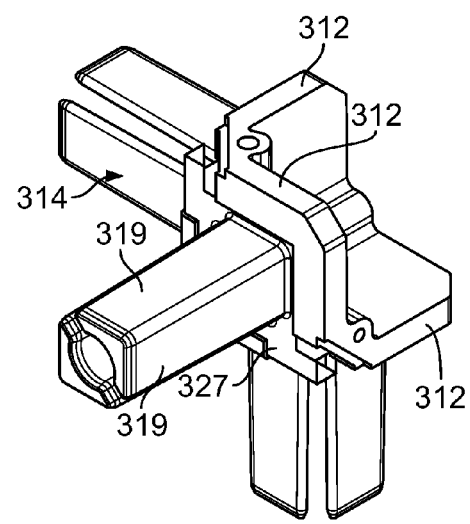
Figure 22:
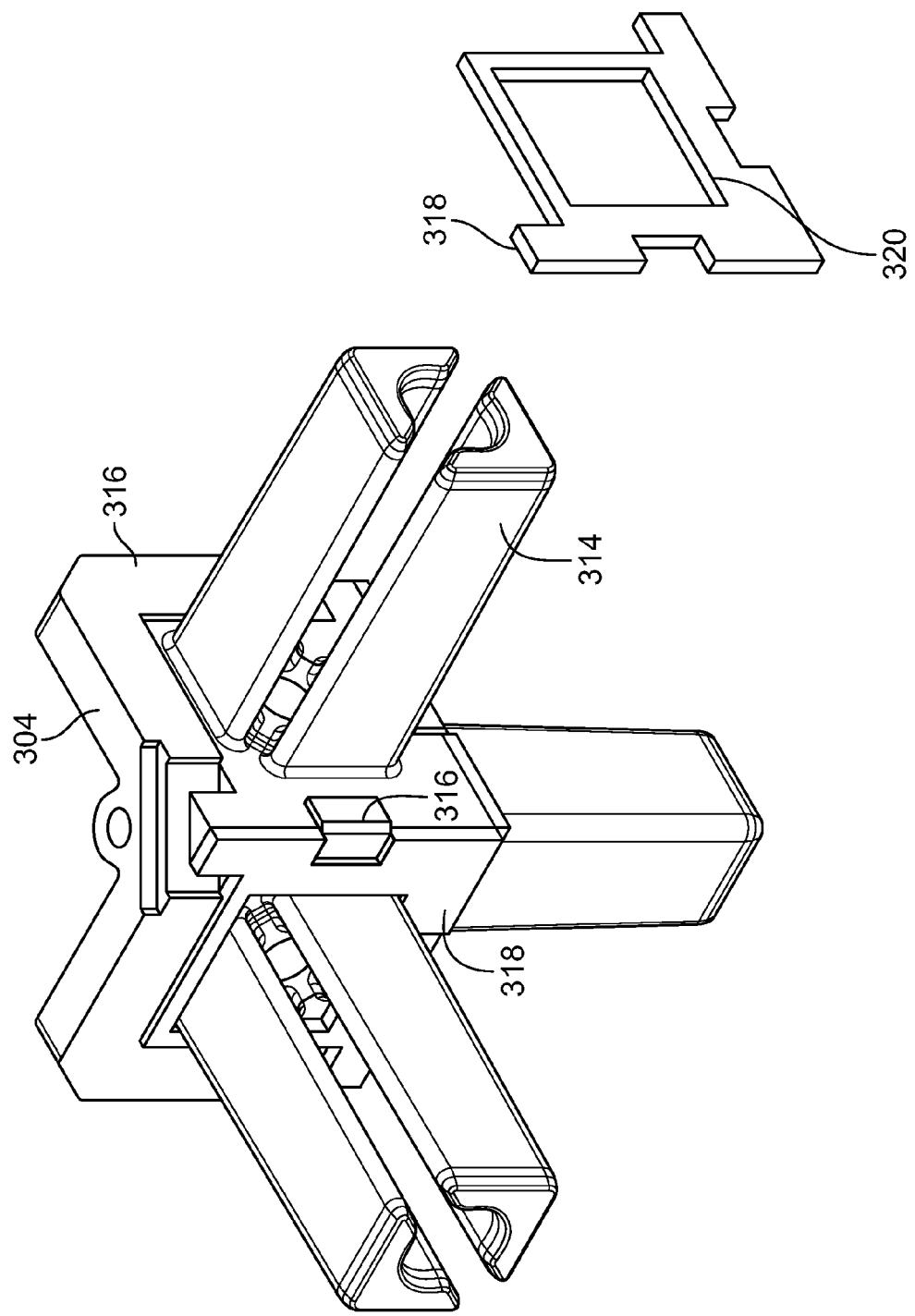
FIG. 22 is a perspective view of the corner copula of FIG. 19 including a gasket.

As shown in FIGS. 21B-C and 22, each corner copula 304 includes raised portions 316 extending from the orthogonal walls 312. These raised portions 316 may define a recessed area 327 between the raised portions and the prong 314 for receiving a gasket 318 or the like. The raised pads 316, the recessed area 327, and the gasket 318 may be substantially similar to the raised pads 220, recessed area 220, and the gasket 222 described above with reference to FIGS. 16B and 16C.

As shown in FIGS. 19-23, the corner copula 304 and each frame member 302 may be coupled via the fastener 322 (e.g., machine bolt, etc.) which may be inserted through the central channel 317 of the prong 314 and an opening 329 of the corner copula and into the boss 309 of the connecting rib 308. After which, the fastener 322 may be rotated, torqued, etc. as desired to tighten the corner copula 304 to the frame member 302.

For example, the corner copula 304 may be coupled to a frame member 302 by placing the gasket 318 against one of the orthogonal walls 312 of the corner copula 304, inserting the prong 314 of the corner copula 304 into the opening 306 of a frame member 302, inserting the fastener 322 through the central channel 317 of the corner copula 304 and into the boss 309 of the frame member 302, and rotating the fastener 322 to tighten the corner copula 304 to the frame member 302. In other embodiments, one or more of the above described steps may be omitted when coupling the corner copula 304 to the frame member 302. Additionally, although the above steps are listed in a particular order, the steps may be performed in any suitable order.

According to another aspect of the present disclosure, a method of constructing an electrical cabinet may include inserting at least two prongs extending from a wall of a corner copula into an opening of a frame member to create a friction fit between the prongs and the interior walls of the frame member. A fastener may be inserted through an opening in the wall of the corner copula, through a central channel defined by the two prongs of the corner copula, and into a central boss structure of a connecting rib inside the opening of the frame member, to couple the corner copula to the frame member. Inserting the two prongs of the corner copula may include guiding the connecting rib and the central boss structure into the central channel between the two prongs. A sealing gasket may be positioned between the wall of the corner copula and the frame member, and may be positioned in a recess defined in the wall of the corner copula.

The above methods and structures describing coupling a corner copula to a frame member having a connecting rib and central boss structure may be used with other methods and structures described herein for coupling corner copulas and frame members to construct an electrical equipment cabinet (e.g., enclosure, etc.). For example, some electrical equipment cabinets may include some frame members joined via a corner copula coupled to connecting ribs and some frame members joined via a corner copula coupled using a wedge.

According to another aspect of the present disclosure, FIG. 24 illustrates a cabinet 400 including frame members 402 and corner copulas 404 coupled between the frame members. Tie bars 406 may be used to couple frame members 402 to the corner copulas 404.

Referring to FIG. 25A, each corner copula 404 includes three protruding members 408 (e.g., sometimes referred to as towers, etc.) extending from a central portion of the corner copula. The protruding members 408 extend orthogonally away from the central portion and are inserted into ends of the frame members 402 when the cabinet 400 is assembled.

As shown in FIG. 25B, each protruding member 408 may be covered by a sleeve 410 (e.g., a gasket such as a polymer sleeve gasket, etc.), which may include walls defining an opening 411 at each end with two of the walls extending at an angle to a point 413. Each sleeve 410 may include two slanted (e.g., sloped, etc.) walls 412 (e.g., 45 degree surfaces, etc.), which may create an arrow-like structure. When the sleeves 410 are positioned on the protruding members 408, each slanted wall 412 may align with a corresponding adjacent slanted wall of an adjacent sleeve 410, thereby covering the protruding members of the corner copula 404.

As shown in FIG. 25C, each sleeve 410 includes a flange 414 extending from the opposite side (e.g., on the bottom side) of the sleeve with respect to the slanted surface 412. The flange 414 may be utilized when mating the frame members 402 to the corner copula 404 as explained further below.

FIG. 25D illustrates sleeve gaskets 410 being positioned about protruding members 408. FIG. 25E illustrates openings 420 in protruding members 408.

FIG. 26A illustrates an example frame member 402. As shown in FIG. 26A, the ends of each frame member 402 include two slanted walls 413, which may or may not correspond to the slanted walls 412 of the sleeves 410 (e.g., sleeve gaskets, etc.). For example, the ends of each frame member 402 may include two walls 413 extending at an angle substantially equal to the angle of the slanted walls 412 of the sleeves 410. In some cases, this angle may be about a 45 degree angle. In other embodiments, other angles may be used (e.g., 30 degrees, 60 degrees, etc.). In some embodiments, the point of the frame member 402 may substantially align with the point of the corresponding sleeve 410.

The slanted walls 412 of the sleeves 410 may each include a raised flange. Each raised flange may contact a slanted wall 413 of a corresponding frame member 402. The raised flange may have a height that is substantially similar to a thickness of the slanted wall 413 of the frame member 402. Thus, the raised flange and slanted wall 413 of the frame member 402 may provide an approximately flush exterior surface when in contact.

FIG. 26B is a cross-sectional view of the frame member 402 of FIG. 26A. The ends of each frame member 402 may be open (e.g., walls of the frame member 402 may define an opening 416, etc.). The opening 416 may be dimensioned, configured, etc. to correspond to the corner copula 404 and/or sleeve 410 to create a friction fit between the interior of each frame member 402 and the exterior of each sleeve and/or corner copula. The opening 416 may include recessed areas for receiving the flanges 414 of the sleeves 410 when the frame members 402 slide over the sleeves. As shown in FIG. 25, each frame member 402 may include two fin walls 418 extending from opposing sides of the frame member, which may facilitate panel mounting. The frame member 402 may have a substantially L-shaped cross-section. The fin walls 418 may overlap one or more panels to provide additional water resistance.

Referring to FIGS. 24-26, after the frame members 402 slide over the corner copulas 404 and sleeves 410, a tie bar 406 is inserted into each frame member and the corner copula 404. For example, the corner copulas 404 may define tie bar openings 420 (e.g., protruding member openings, etc.), and the frame members 402 may define one or more channels 422 through which the tie bar 406 is inserted. Although FIG. 26A illustrates two channels 422, it should be apparent that other embodiments may include more or less channels 422.

The tie bars 406 may be inserted through the channels 422 of the frame members 402 and into the protruding member openings 420. The tie bars 406 may then be manipulated to effectively keep the frame members 402 and the corner copula 404 and sleeve 410 assemblies coupled together (e.g., the frame members may draw into the sleeve gaskets), which may result in a structural cuboid that has a substantially water tight seal between the frame members and the corner copulas.

The tie bars 406 may be solid rods with male threads on both ends, male threads on one end and a drive head on the opposite end, etc. Corresponding receiving fasteners (e.g., nuts, etc.) may be used to couple the male threads. Alternatively, or in addition, some tie bars 406 may be hollowed rods with female threads on each end to accept a fastener (e.g., bolts, etc.). In other embodiments, other suitable tie rods may be used. The frame members 402, corner copulas 404, and/or sleeves 410 may each include access openings 424 for tie bar 406 actuation (e.g., to allow a user to mount the tie bar inside the corner copula). The access openings 424 may be substantially aligned. For example, once a tie bar is inserted into a protruding member opening 420, the tie bar 406 can be accessed through an aligned frame member access opening, sleeve gasket access opening and corner copula access opening. Thus, tie bar 406 can be accessed to secure an end of the tie bar 406 in the corner copula after the tie bar has been inserted into the corner copula.

FIG. 27 illustrates the cabinet 400 including an optional water diverter 426 (e.g., sometimes referred to as a rain gutter component, etc.) extending along one of the frame members 402. The water diverter 426 may include a flange 427 for mounting to the frame members 402 and a flange 429 for directing water away from the cabinet 400.

As shown in FIG. 27, the cabinet 400 includes panels 428. The panels 428 may assemble to the inside surfaces of the frame members 402 via suitable hardware (e.g., bolts, screws, rivets, etc.). Gaskets (e.g., strip gaskets) may be used between the panels 428 and the frame members 402 to resist water entry into the cabinet 400. The fin walls 418 of the frame member 402 may overlap the panels 428 thereby providing an additional level of water resistance.

The cabinet 400 may include a door 430. The door 430 includes a gasket frame 431 which may accept a gasket 432 (e.g., an edge bulb gasket, etc.). When the door 430 is closed, the gasket 432 seals against the outer surfaces of the frame members 402 and compresses against the water directing flange 429 of the gutter 426 which influences water to the sides of the cabinet 400 where the water can harmlessly run off the cabinet.

According to another aspect of the present disclosure, a method of constructing an electrical equipment cabinet may include positioning a first sleeve gasket about a protruding member of a first corner copula to create a friction fit between the first gasket sleeve and the protruding member of the first corner copula, and positioning a second sleeve gasket about a protruding member of a second corner copula to create a friction fit between the second gasket sleeve and the protruding member of the second corner copula. The method may also include positioning an opening at a first end of a frame member about the first gasket sleeve to create a friction fit between the first gasket sleeve and the opening at the first end of the frame member, and positioning an opening at a second end of the frame member about the second gasket sleeve to create a friction fit between the second gasket sleeve and the opening at the second end of the frame member, thereby coupling the frame member between the first corner copula and the second corner copula.

A tie rod may be inserted into the opening of the first corner copula, through the channel of the frame member, and into the opening of the protruding member of the second corner copula. The tie rod may be secured to each corner copula via a sleeve gasket access opening and a corresponding frame member access opening.

Any one or more example aspects described above relative to FIGS. 23-27 may be used in combination with any other aspects disclosed herein without departing from the scope of the present disclosure.

The example tie bar construction features may provide one or more advantages, including a custom polymer sleeve gasket to enhance resistance to water entry between a corner copula and a frame member, tie bar connections for structurally sound assembly connections between frame members and corner copulas, tie bars that draw frame members into polymer sleeve gaskets to create a structural cuboid with a water tight seal, etc.

According to another aspect of the present disclosure, a continuous stand-alone door gasket frame is disclosed, which may assemble directly to a cabinet frame, door, etc. and serve as a sealing interface between the cabinet frame and the door. The door gasket frame may be assembled to any side of a cabinet where a door is to be used, and may accept a bulb gasket (or the like) to seal the door opening.

For example, FIG. 28 illustrates a substantially continuous gasket frame 500 (e.g., sometimes referred to as a door gasket frame), which may correspond to the size of a door opening to be sealed, define a perimeter corresponding to the door opening, etc. The gasket frame 500 may be L-shaped with respect to its cross sectional view.

As shown in FIG. 28, the gasket frame 500 may include a mounting flange 502 and a sealing flange 504. The mounting flange 502 may define openings 506 (e.g., sometimes referred to as mounting holes, etc.) for receiving fasteners (e.g., rivets, bolts, screws, etc.) to mount the gasket frame 500 to a cabinet frame.

In the example of FIG. 28, the sealing flange 504 includes a protruding ledge 505 and corner portions 508. The protruding ledge 505 and the corner portions 508 are configured to receive a gasket (e.g., bulb gasket, etc.). For example, a bulb gasket may be placed about the sealing flange 504, and the bulb gasket may contact a back surface of a door when the door is in a closed position to inhibit water from entering the cabinet. Additionally, or alternatively, the protruding ledge 505 and/or the corner portions 508 may be used to compress a gasket (e.g., strip gasket, etc.) positioned on a door, panel, etc. attached to the gasket frame 500. For example, a strip gasket may be placed on the back surface of the door and the sealing flange 504 may compress the strip gasket when the door is in a closed position to inhibit water from entering the cabinet.

FIG. 29 illustrates a portion of a cabinet including multiple cabinet frame members 501, panels 514 mounted to the frame members 501, and the door gasket frame 500 of FIG. 28 mounted to the frame members 501. As shown in FIG. 29, the door gasket frame 500 is mounted to the cabinet frame members 501 by passing rivets 512 or the like through the openings 506. For example, the gasket frame 500 may be mounted to the frame members 501 by placing the gasket frame 500 against a surface of the frame members 501 and inserting rivets 512 or the like through the openings 506 of the gasket frame and into rivet slots or the like of the frame members 501. Alternatively, or additionally, the door gasket frame 500 may be mounted to the frame members in another suitable manner including, for example, adhesives (such as tape, glue, etc.), etc.

As shown in FIGS. 28 and 29, the gasket frame geometry may be continuous. Thus, the gasket frame 500 may include no gaps, separation, etc. (e.g., around the corners, etc.) thereby inhibiting water leakage into the cabinet. In some examples, the door gasket frame 500 may be fabricated using a single piece extrusion, cut to a specific length, then bent, formed, etc. into a final shape with one seam 516 (e.g., the seam at the bottom of the gasket frame 500 in FIG. 28). The ends of the extrusion (e.g., at the seam) may be secured together using any suitable securing method, including through welding (e.g., if the gasket frame 500 is metal), an adhesive (e.g., if the gasket frame is plastic), etc. The door gasket frame 500 may be any suitable material, including aluminum, plastic, etc.

Alternatively, a gasket frame may include separate portions joined together. For example, FIG. 30A illustrates portions of a gasket frame. The portions include linear portions 518 (e.g., sometimes referred to as extrusions) and corner portions 520, which may be joined together (e.g., at areas designated by reference number 522 in FIG. 30B) through welding, adhesives, etc. as explained above. Thus, the example gasket frames may not include any gaps, separation, etc.

According to another aspect of the present disclosure, a method of coupling a substantially continuous door gasket frame to an electrical equipment cabinet includes forming a mounting flange and a sealing flame of a substantially continuous door gasket frame; shaping a perimeter of the substantially continuous door gasket frame to correspond to a perimeter of one of the sides of the cabinet, and coupling the mounting flange to four adjacent frame members. An edge bulb gasket may be applied to the sealing flange. A strip gasket may be attached to a back surface of a door, where the strip gasket perimeter corresponds to the perimeter of the sealing flange. Forming the mounting and sealing flanges may include welding multiple corner pieces and linear extrusions together, coupling corner pieces and linear extrusions together using adhesive, etc.

Some of the continuous door gasket frame features described herein may provide one or more advantages, including mounting a door gasket frame in a similar manner to a panel, wall, etc., proving a continuous door gasket frame construction to reduce potential water leak paths, allowing for door configuration flexibility, etc.

Any of the example embodiments and aspects disclosed herein may be used in any suitable combination with any other example embodiments and aspects disclosed herein without departing from the scope of the present disclosure. For example, any external frame channels, surfaces, components etc., any internal frame channels, surfaces, components, etc., any structure and/or methods for coupling corner copulas, frame members, door gasket frames, etc. may be used and combined in any suitable fashion without departing from the scope of the present disclosure.

According to another aspect of the present disclosure, example methods of assembling cabinet frames are disclosed. Example methods may include at least one of any of the following: (a) providing frame members having channels and/or surfaces on an external side of the frame member; (b)

providing frame members having channels and/or surfaces on an internal side of the frame member; (c) coupling frame members together via corner copulas to assemble a cabinet frame; (d) coupling frame members to corner copulas via a tie bar; (e) coupling frame members to corner copulas via a wedge; (f) coupling a corner copula to a frame member by inserting a connecting rib in an opening at an end of the frame member into a central channel of a prong of the corner copula; (g) attaching internal components to the cabinet frame; (h) attaching external components to the cabinet frame; and (i) forming a continuous door gasket frame and connecting the door gasket frame to a door or frame member.

Example embodiments and aspects of the present disclosure may provide any of the following advantages: panels and strip gaskets can be externally assembled with a riveting operation on any side of the cabinet frame and drilling holes is not required, bulb seals and/or gasket frames with strip gaskets can be externally assembled on any side of the cabinet frame without secondary operations, covers can conceal external hardware and inhibit the need to paint a frame member, corner copula, etc., slots may allow for door assembly without secondary operation, various size cabinets in any configuration may be built using a single frame member profile geometry and a single corner copula geometry which may eliminate the need to inventory multiple components, lack of secondary operation requirements to mount panels and doors to frame members may reduce assembly build times and the risk of damaging frame members, internal equipment configuration can occur prior to cabinet panel assembly so that external panels do not interfere with internal equipment assembly, secondary operations may not be required for internal equipment assembly, sealed joints to prevent water from entering the cabinet, stronger coupling of corner copulas and frame members, improved sealing of door gasket frames through a continuous frame, etc.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. An electrical equipment cabinet comprising:
a plurality of frame members defining four sides, a top, and a bottom of the cabinet, each frame member including an end defining an opening;
a wedge defining an opening, the wedge configured to create a friction fit between the wedge and one of the frame members when the wedge is positioned in the opening of said one of the frame members;
a corner copula having a wall and a prong extending from the wall, the prong configured to create a friction fit between the prong and the wedge to inhibit relative movement between the prong and the wedge when the prong is positioned in the opening of the wedge, the wedge including at least two separate arms to enhance the friction fit between said one of the frame members and the wedge, and the friction fit between the wedge and the corner copula prong;
a gasket positioned around the corner copula prong between the wall of the corner copula and the opening of said one of the frame members; and
a fastener configured to couple the wedge to the corner copula and to draw the wedge and said one of the frame members against the gasket.

2. The electrical equipment cabinet of claim 1, wherein the wall of the corner copula defines a recess and the gasket is positioned in the recess of the corner copula.

3. The electrical equipment cabinet of claim 2, wherein the wall of the corner copula includes at least one raised portion that defines at least a portion of the recess, and wherein a thickness of the gasket exceeds a height of the at least one raised portion such that the gasket is compressed when the wedge and said one of the frame members are coupled to the corner copula.

4. The electrical equipment cabinet of claim 1, wherein:
the corner copula defines a central channel;
the wedge includes a central fastener receiver aligned with the central channel of the corner copula; and
the fastener extends through the central channel of the corner copula and is received in the fastener receiver of the wedge.

5. The electrical equipment cabinet of claim 4, wherein the central fastener receiver includes female threads and the fastener includes a machine bolt.

6. The electrical equipment cabinet of claim 1, wherein the gasket is positioned to substantially seal the corner copula and the opening of said one of the frame members to inhibit water from entering the electrical equipment cabinet via the a connection between the frame member and the corner copula.

7. The electrical equipment cabinet of claim 1, wherein:
the wedge includes a back wall;
the at least two separate arms of the wedge extend from the back wall to define the opening of the wedge; and
the corner copula prong is received within the opening of the wedge between the at least two separate arms of the wedge.

8. The electrical equipment cabinet of claim 7, wherein the at least two separate arms include at least four separate arms arranged in a substantially square shape.

9. The electrical equipment cabinet of claim 7, wherein each separated arm of the wedge tapers from a first end of the arm adjacent the back wall to a second end of the arm opposite the back wall.

10. The electrical equipment cabinet of claim 1, wherein:
the wall of the corner copula is a first wall and the prong is a first prong;
the corner copula further includes a second wall having a second prong and a third wall having a third prong; and
the first, second and third walls of the corner copula are perpendicular to one another.

11. The electrical equipment cabinet of claim 10, wherein the wedge is a first wedge, the electrical equipment cabinet further comprising:
a second wedge coupled between the second prong of the corner copula and a second one of the plurality of frame members via a friction fit; and
a third wedge coupled between the third prong of the corner copula and a third one of the plurality of frame members via a friction fit.

12. A method of coupling a frame member of an electrical equipment cabinet to a corner copula using a wedge, the frame member defining an opening at an end of the frame member, the wedge having at least two separate arms defining an opening of the wedge, and the corner copula having a prong extending from a wall of the corner copula, the method comprising:
- inserting the wedge into the opening of the frame member to couple the wedge to the frame member via a friction fit; and
- subsequently, inserting the prong of the corner copula into the opening of the wedge to couple the corner copula to the wedge via a friction fit that inhibits relative movement between the prong and the wedge, wherein the at least two separate arms of the wedge enhance the friction fit between the frame member and the wedge, and the friction fit between the wedge and the corner copula wherein the corner copula defines a central opening and the wedge includes a central fastener receiver, the method further comprising: inserting a fastener through the central opening of the corner copula and into the fastener receiver to couple the corner copula to the wedge.

13. The method of claim 12, further comprising positioning a gasket around the corner copula prong between the wall of the corner copula and the opening of the frame member to inhibit water from entering the electrical equipment cabinet through a connection between the corner copula and the frame member.

14. The method of claim 13, wherein the wall of the corner copula defines a recess and wherein positioning the gasket includes positioning the gasket in the recess.

15. A method of coupling a frame member of an electrical equipment cabinet to a corner copula using a wedge, the frame member defining an opening at an end of the frame member, the wedge having a central fastener receiver, the wedge having at least two separate arms defining an opening of the wedge, the corner copula having a prong extending from a wall of the corner copula, the corner copula defining a central opening, the method comprising:
- inserting the wedge into the opening of the frame member to couple the wedge to the frame member via a friction fit;
- inserting the prong of the corner copula into the opening of the wedge to couple the corner copula to the wedge via a friction fit that inhibits relative movement between the prong and the wedge, wherein the at least two separate arms of the wedge enhance the friction fit between the frame member and the wedge, and the friction fit between the wedge and the corner copula;
- positioning a gasket around the corner copula prong between the wall of the corner copula and the opening of the frame member to inhibit water from entering the electrical equipment cabinet through a connection between the corner copula and the frame member; and
- inserting a fastener through the central opening of the corner copula and into the central fastener receiver of the wedge to couple the corner copula to the wedge.

16. The method of claim 15, further comprising rotating the fastener to draw the wedge and frame member against the gasket.

17. The method of claim 16, wherein:
- the wall of the corner copula includes at least one raised portion that defines at least a portion of a recess and a thickness of the gasket exceeds a height of the at least one raised portion;
- positioning the gasket includes positioning the gasket in the recess; and
- rotating the fastener includes rotating the fastener until the frame member is in contact with the at least one raised portion, thereby compressing the gasket.

18. The method of claim 15, wherein the central fastener receiver includes female threads and the fastener includes a machine bolt.

* * * * *